(12) United States Patent
Jang et al.

(10) Patent No.: US 11,930,684 B2
(45) Date of Patent: Mar. 12, 2024

(54) DISPLAY DEVICE

(71) Applicant: Samsung Display Co., Ltd., Yongin-Si (KR)

(72) Inventors: Chang Soon Jang, Seoul (KR); Keun Chan Oh, Hwaseong-si (KR); Gak Seok Lee, Hwaseong-si (KR); Sang Hun Lee, Hwaseong-si (KR); So Yun Lee, Seoul (KR); Ji Eun Jang, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 331 days.

(21) Appl. No.: 17/337,476

(22) Filed: Jun. 3, 2021

(65) Prior Publication Data

US 2022/0052121 A1    Feb. 17, 2022

(30) Foreign Application Priority Data

Aug. 14, 2020    (KR) .......................... 10-2020-0102239

(51) Int. Cl.
*H10K 59/38* (2023.01)
*H10K 50/842* (2023.01)
*H10K 50/86* (2023.01)
*H10K 59/12* (2023.01)

(52) U.S. Cl.
CPC ......... *H10K 59/38* (2023.02); *H10K 50/8428* (2023.02); *H10K 50/865* (2023.02); *H10K 59/12* (2023.02)

(58) Field of Classification Search
None
See application file for complete search history.

(56) References Cited

U.S. PATENT DOCUMENTS

| 10,665,641 B2 * | 5/2020 | Wang .................... H10K 59/38 |
| 2006/0012288 A1 * | 1/2006 | Terakado .............. H10K 59/38 313/506 |
| 2007/0200492 A1 | 8/2007 | Cok et al. |

(Continued)

FOREIGN PATENT DOCUMENTS

| JP | 2017-073260 A | 4/2017 |
| KR | 10-2019-0143559 A | 12/2019 |

(Continued)

OTHER PUBLICATIONS

Extended European Search Report, Application No. 21190392.7, dated Dec. 20, 2021, 10 pages.

*Primary Examiner* — Evren Seven
(74) *Attorney, Agent, or Firm* — Innovation Counsel LLP

(57) ABSTRACT

Provided is a display device. The display device includes a first base portion, a second base portion facing the first base portion, a light emitting layer disposed on one surface of the first base portion and emitting first light, a first wavelength conversion pattern disposed on the light emitting layer and converting the first light into second light having a different wavelength from the first light, a first color filter overlapping the first wavelength conversion pattern on one surface of the second base portion and spaced apart from the first wavelength conversion pattern, and an air layer interposed between the first wavelength conversion pattern and the first color filter.

15 Claims, 15 Drawing Sheets

(56) References Cited

U.S. PATENT DOCUMENTS

| | | | | |
|---|---|---|---|---|
| 2013/0112955 A1* | 5/2013 | Yamazaki | ......... | H10K 50/8428 |
| | | | | 257/E33.072 |
| 2018/0047800 A1* | 2/2018 | Choi | .................... | G09G 3/3233 |
| 2018/0122836 A1 | 5/2018 | Kang et al. | | |

FOREIGN PATENT DOCUMENTS

| | | |
|---|---|---|
| KR | 10-2020-0031750 A | 3/2020 |
| WO | 2013-073521 A1 | 5/2013 |
| WO | 2020-141651 A1 | 7/2020 |

\* cited by examiner

DISPLAY DEVICE

CROSS-REFERENCE TO RELATED APPLICATION

This application claims priority from Korean Patent Application No. 10-2020-0102239 filed on Aug. 14, 2020, in the Korean Intellectual Property Office, and all the benefits accruing therefrom under 35 U.S.C. 119, the contents of which in its entirety are herein incorporated by reference.

BACKGROUND

1. Field

The present disclosure relates to a display device. More particularly, the present disclosure relates to a display device capable of improving light emission efficiency.

2. Description of the Related Art

The importance of a display device has increased with the development of various types of multimedia devices. Accordingly, various types of display devices, such as a liquid crystal display (LCD) device and an organic light emitting diode display (OLED) device have been used.

Among display devices, a self-light emitting display device includes a self-light emitting element such as an organic light emitting element. The self-light emitting element may include two electrodes facing each other and a light emitting layer interposed therebetween. When the self-light emitting element is an organic light emitting element, electrons and holes provided from the two electrodes are recombined in the light emitting layer to generate excitons, and the excitons are changed from an excited state to a ground state to emit light.

Each pixel of a display device may be set to uniquely display any one of a plurality of colors. Each pixel may display an assigned color through the light itself emitted by a self-light emitting element included therein, but may also display the corresponding color by converting the wavelength of the light emitted by the self-light emitting element through a wavelength conversion pattern and/or a color conversion pattern. The light, the wavelength thereof being converted through the wavelength conversion pattern, may be emitted to the outside through layers disposed on the wavelength conversion pattern.

SUMMARY

Aspects of the present disclosure are to provide a display device capable of improving light emission efficiency.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

An embodiment of a display device includes a first base portion, a second base portion facing the first base portion, a light emitting layer disposed on one surface of the first base portion and emitting first light, a first wavelength conversion pattern disposed on the light emitting layer and converting the first light into second light having a different wavelength from the first light, a first color filter overlapping the first wavelength conversion pattern on one surface of the second base portion and spaced apart from the first wavelength conversion pattern, and an air layer interposed between the first wavelength conversion pattern and the first color filter.

An embodiment of a display device includes a first base portion including a light emitting area and a non-light emitting area surrounding the light emitting area, a second base portion including a light transmitting area and a light blocking area surrounding the light transmitting area and facing the first base portion, a wavelength conversion pattern disposed in the light emitting area of the first base portion; a color filter disposed in the light transmitting area of the second base portion and facing the wavelength conversion pattern, an air layer interposed between the wavelength conversion pattern and the color filter, and a spacer disposed between the wavelength conversion pattern and the color filter and having a side surface at least partially surrounded by the air layer.

An embodiment of a display device includes a first substrate including a wavelength conversion pattern converting a wavelength of incident light to have a peak wavelength within a specific wavelength range, a second substrate including a color filter disposed to face the wavelength conversion pattern, an air layer disposed between the wavelength conversion pattern and the color filter, and a spacer disposed between the wavelength conversion pattern and the color filter and having a side surface at least partially surrounded by the air layer.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION OF THE EMBODIMENTS

The present disclosure will now be described more fully hereinafter with reference to the accompanying drawings, in which preferred embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Hereinafter, embodiments of the present disclosure will be described with reference to the attached drawings.

Figure 1:
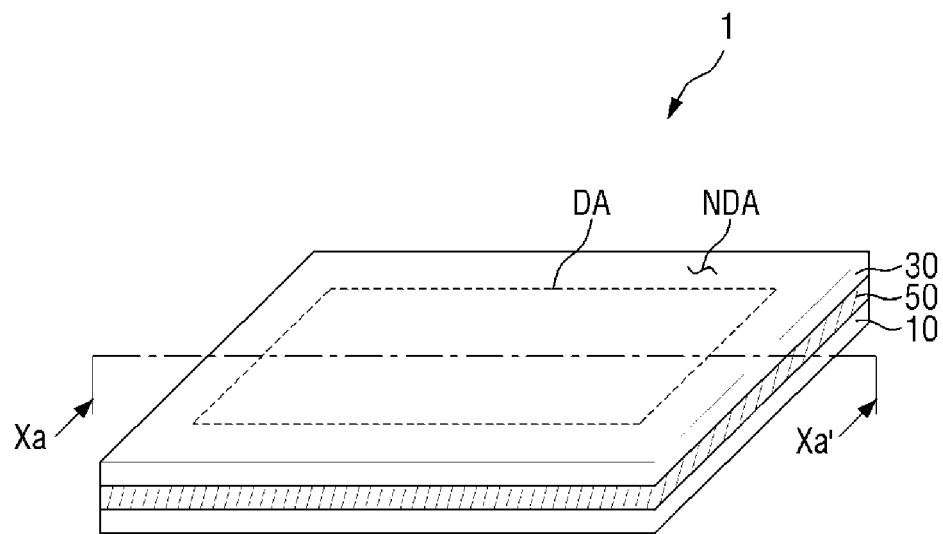
FIG. 1 is a perspective view of a display device according to an embodiment.
Figure 1:
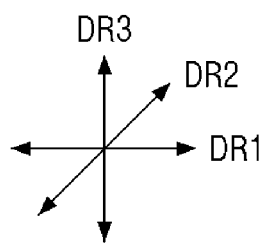
Figure 2:
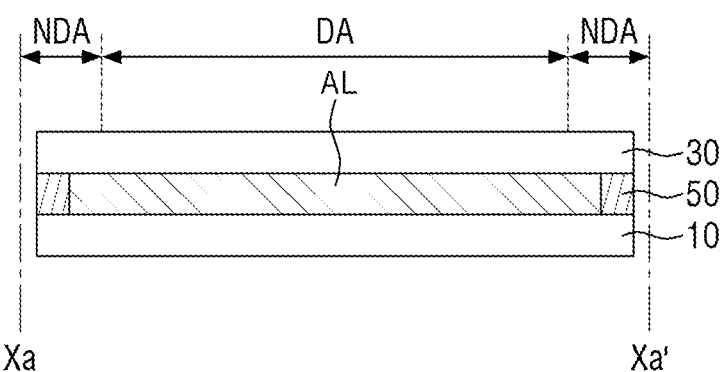
FIG. 2 is a cross-sectional view of the display device taken along line Xa-Xa' of FIG. 1.
Figure 2:
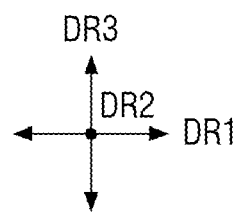

FIG. 1 is a perspective view of a display device according to an embodiment, and FIG. 2 is a cross-sectional view of the display device taken along the line Xa-Xa' of FIG. 1.

Hereinafter, the first direction DR1, the second direction DR2, and the third direction DR3 intersect in different directions from each other. The first direction DR1 may be a horizontal direction. The second direction DR2 may be a vertical direction. The third direction DR3 may be a thickness direction. The first direction DR1, the second direction DR2, and/or the third direction DR3 may include two or more directions. For example, the third direction DR3 may include an upward direction toward the upper side of the drawing and a downward direction toward the lower side of the drawing. Accordingly, one surface of a member disposed to face in an upward direction may be referred to as an upper surface, and the other surface of the member disposed to face in a downward direction may be referred to as a lower surface. However, the directions are illustrative and relative, and are not limited to those mentioned above.

A display device 1 according to an embodiment may be applied to a portable electronic appliance such as a mobile phone, a smart phone, a tablet personal computer (table PC), a mobile communication terminal, and electronic notebook, an e-book, a portable multimedia player (PMP), a navigator, or ultra mobile PC (UMPC). Alternatively, the display device 1 according to an embodiment may be applied to a display unit of a television, a notebook, a monitor, a billboard, or internet of things (JOT). Alternatively, the display device 1 according to an embodiment may be applied to a wearable device such as a smart watch, a watch phone, an eyeglass display, or a head mounted display (HMD). Alternatively, the display device 1 according to an embodiment may be applied to a center information display placed in a car instrument panel, a car center fascia or a carbon dashboard, a room mirror display replacing a car side mirror, or a display placed on the back surface of a front seat as an entertainment for a back seat of a car.

Referring to FIGS. 1 and 2, the display device 1 may have a rectangular shape in a plan view. For example, the display device 1 may include two long sides extending in the first direction DR1 and two short sides extending in the second direction DR2 in a plan view. The corner of the display device 1 may be right-angled, and may also be rounded to have a convex curvature. However, the planar shape of the display device 1 is not limited thereto, and may have various shapes such as a circle, an ellipse, a rhombus, and a trapezoid.

The display device 1 having a flat shape is illustrated in FIGS. 1 and 2, but the present disclosure is not limited thereto. The display device 1 may be a curved display device, a flexible display device, a foldable display device, a stretchable display device, and/or a rollable display device.

The display device 1 may include a display area DA and a non-display area NDA. The display area DA is an area where an image is displayed, and the non-display area NDA is an area where an image is not displayed. The non-display area NDA may be disposed to surround each edge of the display area DA, but is not limited thereto.

The display device 1 may include a first substrate 10, a second substrate 30, a sealing member 50, and an air layer AL.

The first substrate 10 may include elements and circuits for displaying an image. For example, the first substrate 10 may include a pixel circuit such as a switching element, and a self-light emitting element disposed in a light emitting area of each pixel. The self-light emitting element may include at least one of an organic light emitting diode, a quantum dot light emitting diode, an inorganic micro light emitting diode (for example, inorganic micro LED), and an inorganic nano light emitting diode (for example, inorganic nano LED). Hereinafter, for convenience of explanation, a case where the self-light emitting element is an organic light emitting diode will be described. As will be described later, the first substrate 10 may further include a wavelength conversion pattern that transmits light emitted from a light emitting area or converts the wavelength of the light.

The second substrate 30 may face the first substrate 10. The second substrate 30 may convert the color of light incident from the first substrate 10.

The sealing member 50 may be disposed between the first substrate 10 and the second substrate 30 to couple the first substrate 10 and the second substrate 30. The sealing member 50 may include epoxy resin.

The sealing member 50 may be disposed in the non-display area NDA. Further, the sealing member 50 may have a frame shape, and may be disposed along the edges of the first substrate 10 and the second substrate 30 to define a sealed space between the first substrate 10 and the second substrate 30.

The air layer AL may be provided between the first substrate 10 and the second substrate 30. The air layer AL may be disposed in the space sealed by the sealing member 50 or may fill the space. Details of the air layer AL will be described later.

Hereinafter, a specific pixel structure of the display device 1 will be described.

Figure 3:
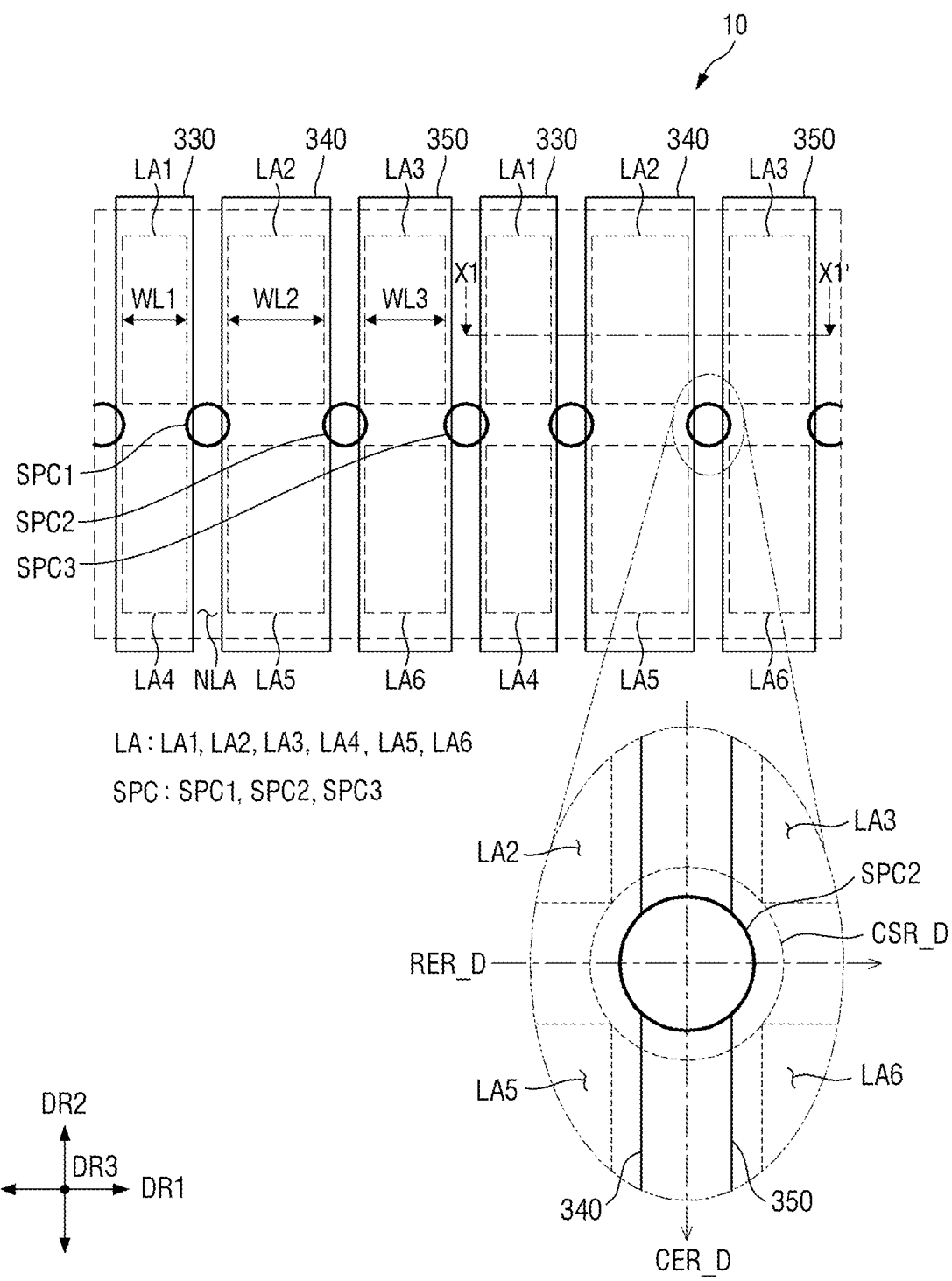
FIG. 3 is a plan view of a first substrate of a display device according to an embodiment in a display area.
Figure 4:
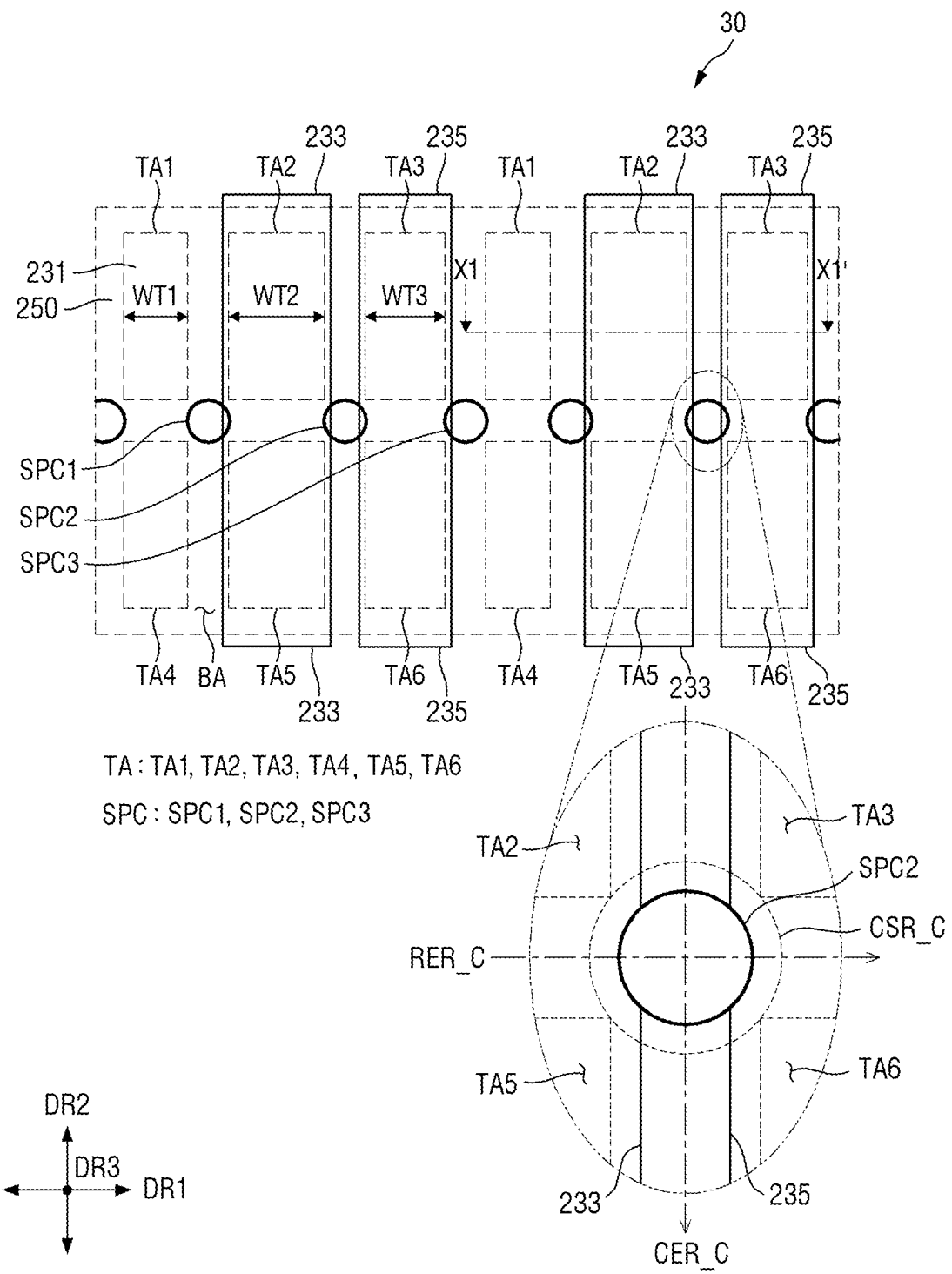
FIG. 4 is a plan view of a second substrate of a display device according to an embodiment in a display area.

FIG. 3 is a plan view of a first substrate of a display device according to an embodiment in a display area, and FIG. 4 is a plan view of a second substrate of a display device according to an embodiment in a display area.

Firstly, referring to FIGS. 1, 2, and 3, the first substrate 10 may include a plurality of light emitting areas LA and a non-light emitting area NLA, which are disposed in the display area DA.

The light emitting area LA refers to an area where light generated by the light emitting element of the first substrate 10 is emitted to the outside of the first substrate 10, and the non-light emitting area NLA refers to an area where the light is not emitted to the outside of the first substrate 10. The plurality of light emitting areas LA and the non-light emitting area NLA may be defined by a pixel defining layer 150, a panel light blocking member 190, and/or a light emitting layer OL, which will be described later, but the present disclosure is not limited thereto.

The plurality of light emitting areas LA may be arranged in a matrix form. In an embodiment, the plurality of light emitting areas LA may be arranged to form a plurality of rows extending in the first direction DR1 and a plurality of columns extending in the second direction DR2.

The plurality of light emitting areas LA may include a first light emitting area LA1, a second light emitting area LA2, a third light emitting area LA3, a fourth light emitting area LA4, a fifth light emitting area LA5, and a sixth light emitting area LA6. In an embodiment, the first light emitting area LA1, the second light emitting area LA2, and the third light emitting area LA3 may be sequentially arranged in the first row, and the fourth light emitting area LA4, the fifth light emitting area LA5, and the sixth light emitting area LA6 may be sequentially arranged in the second row neighboring the first row. Further, the first light emitting area LA1 and the fourth light emitting area LA4 may be arranged in the first column, the second light emitting area LA2 and the fifth light emitting area LA5 may be arranged in the second column, and the third light emitting area LA3 and the sixth light emitting area LA6 may be arranged in the third column. Although six light emitting areas are illustrated in FIG. 3, the number and arrangement of the plurality of light emitting areas LA are not limited thereto. When a larger number of light emitting areas form a larger number of rows and columns, the aforementioned arrangement rules may be repeated along the row and/or column direction.

The plurality of light emitting areas LA may have the same size or different sizes. In an embodiment, the widths of the light emitting areas LA in the second direction DR2 may be equal to each other, and in this case, the difference in size between the light emitting areas LA may be determined by the widths of the light emitting areas LA in the first direction DR1. In some embodiments, the first width WL1 of the first light emitting area LA1 along the first direction DR1 may be smaller than each of the second width WL2 of the second light emitting area LA2 and the third width WL3 of the third light emitting area LA3, and the second width WL2 of the second light emitting area LA2 along the first direction DR1 may be larger than the third width WL3 of the third light emitting area LA3. In this case, the area of the first light emitting area LA1 may be smaller than each of the area of the second light emitting area LA2 and the area of the third light emitting area LA3, and the area of the second light emitting area LA2 may be larger than the area of the third light emitting area LA3. However, the relative sizes of the light emitting areas LA is not limited to those illustrated above. For example, two of the first width WL1, the second width WL2, and the third width WL3 may be equal to each other, or all of the first width WL1, the second width WL2, and the third width WL3 may be equal to each other.

The fourth light emitting area LA4, the fifth light emitting area LA5, and the sixth light emitting area LA6 may be substantially the same as or similar to the first light emitting LA1, the second light emitting area LA2, and the third light emitting area LA3, respectively. Specifically, the fourth light emitting area LA4, the fifth light emitting area LA5, and the sixth light emitting area LA6 may have the same arrangement, size and/or configuration as the first light emitting LA1, the second light emitting area LA2, and the third light emitting area LA3, respectively.

In an embodiment, as will be described later, each light emitting area LA may emit light having a peak wavelength within a different wavelength range by converting the peak wavelength of the light of a first color emitted from the light emitting layer. For example, the first light emitting area LA1 may emit blue light having a peak wavelength in the range of about 400 nm to 480 nm, the second light emitting area LA2 may emit red light having a peak wavelength in the range of about 610 nm to about 650 nm, and the third light emitting area LA3 may emit green light having a peak wavelength in the range of about 510 nm to about 550 nm.

The non-light emitting area NLA may be disposed to surround each of the plurality of light emitting areas LA. The non-light emitting area NLA may be disposed in a lattice shape.

The non-light emitting area NLA may include a plurality of row-direction extension regions RER_D extending in the first direction DR1, a plurality of column-direction extension regions CER_D extending in the second direction DR2, and a plurality of crossing regions CSR_D formed by crossing the row-direction extension regions RER_D and the column-direction extension regions CER_D. The row-direction extension regions RER_D may be disposed between two adjacent rows of the plurality of light emitting areas LA, and the column-direction extension regions CER_D may be disposed between two adjacent columns of the plurality of light emitting areas LA. The crossing regions CSR_D may be disposed between adjacent corners of the plurality of light emitting areas LA.

Referring to FIGS. 1, 2 and 4, the second substrate 30 may include a plurality of light transmitting areas TA and a light blocking area BA, which are disposed in the display area DA.

The light transmitting area TA refers to an area where incident light emitted from the first substrate 10 is transmitted to the outside of the display device 1, and the light blocking area BA refers to an area where light emitted from the first substrate 10 is not transmitted. The plurality of light transmitting areas TA and the light blocking area BA may be defined by a light blocking member, a color filter, and/or a color pattern, which will be described later.

The plurality of light transmitting areas TA may be arranged in a matrix form. In an embodiment, the plurality of light transmitting areas TA may be arranged to form a plurality of rows extending in the first direction DR1 and a plurality of columns extending in the second direction DR2.

The plurality of light transmitting areas TA may include a first light transmitting area TA1, a second light transmitting area TA2, a third light transmitting area TA3, a fourth light transmitting area TA4, a fifth light transmitting area TA5, and a sixth light transmitting area TA6. In an embodiment, the first light transmitting area TA1, the second light transmitting area TA2, and the third light transmitting area TA3 may be sequentially arranged in the first row, and the fourth light transmitting area TA4, the fifth light transmitting area TA5, and the sixth light transmitting area TA6 may be sequentially arranged in the second row. Further, the first light transmitting area TA1 and the fourth light transmitting area TA4 may be arranged in the first column, the second light transmitting area TA2 and the fifth light transmitting area TA5 may be arranged in the second column, and the third light transmitting area TA3 and the sixth light transmitting area TA6 may be arranged in the third column. Although six light transmitting areas are illustrated in FIG. 4, the number and arrangement of the plurality of light transmitting areas TA are not limited thereto. When a larger number of light transmitting areas form a larger number of rows and columns, the aforementioned arrangement rules may be repeated along the row and/or column direction.

The plurality of light transmitting areas TA may be arranged corresponding to the plurality of light emitting areas LA, respectively. Specifically, the plurality of light transmitting areas TA may be arranged to at least partially overlap the plurality of light emitting areas LA in the thickness direction. Accordingly, the non-light emitting area NLA and the light blocking area BA may also be arranged to at least partially overlap each other in the thickness direction. In an embodiment, the first light emitting area LA1, the second light emitting area LA2, and the third light emitting area LA3 may overlap the first light transmitting area TA1, the second light transmitting area TA2, and the third light transmitting area TA3 in the thickness direction, respectively.

Referring to FIG. 4, similarly to the plurality of light emitting areas LA, the plurality of light transmitting areas TA may have the same size or different sizes. In an embodiment, the widths of the light transmitting areas TA in the second direction DR2 may be equal to each other, and in this case, the difference in size between the light transmitting areas TA may be determined by the widths of the light transmitting areas TA in the first direction DR1. In some embodiments, the first width WT1 of the first light transmitting area TA1 along the first direction DR1 may be smaller than each of the second width WT2 of the second light transmitting area TA2 and the third width WT3 of the third light transmitting area TA3, and the second width WT2 of the second light transmitting area TA2 along the first direction DR1 may be larger than the third width WT3 of the third light transmitting area TA3. In this case, the area of the first light transmitting area TA1 may be smaller than each of the area of the second light transmitting area TA2 and the area of the third light transmitting area TA3, and the area of the second light transmitting area TA2 may be larger than the area of the third light transmitting area TA3. However, the relative sizes of the light transmitting areas TA is not limited to those illustrated above. For example, two of the first width WT1, the second width WT2, and the third width WT3 may be equal to each other, or all of the first width WT1, the second width WT2, and the third width WT3 may be equal to each other.

In some embodiments, the sizes of the plurality of light transmitting areas TA may be the same as the sizes of the plurality of light emitting areas LA, respectively. In some embodiments, the sizes of the plurality of light transmitting areas TA may be different from the sizes of the plurality of light emitting areas LA, respectively. For example, the widths of the first light transmitting area TA1, the second light transmitting area TA2, and the third light transmitting area TA3 may be larger or smaller than the widths of the first light emitting area LA1, the second light emitting area LA2, and the third light emitting area LA3, respectively.

The fourth light transmitting area TA4, the fifth light transmitting area TA5, and the sixth light transmitting area TA6 may be substantially the same as or similar to the first light emitting TA1, the second light transmitting area TA2, and the third light transmitting area TA3, respectively. Specifically, the fourth light transmitting area TA4, the fifth light transmitting area TA5, and the sixth light transmitting area TA6 may have the same arrangement, size and/or configuration as the first light emitting TA1, the second light transmitting area TA2, and the third light transmitting area TA3, respectively.

Referring to FIGS. 1, 2, and 4, the light of the first color provided from the first substrate 10 may be provided to the outside of the display device 1 by passing through the plurality of light transmitting areas TA. The lights transmitted to the outside of the display device 1 through the first light transmitting area TA1, the second light transmitting area TA2, and the third light transmitting area TA3 may be referred to as a first emission light La (shown in FIG. 5) and a second emission light Lb (shown in FIG. 5), and third emission light Lc (shown in FIG. 5), respectively.

The first emission light La may be light of a first color, the second emission light Lb may be light of a second color, and the third emission light Lc may be light of a third color. In an embodiment, the first color, the second color, and the third color may be different colors from each other. Specifically, as described above, the light of the first color may be blue light having a peak wavelength in the range of about 440 nm to 480 nm. Further, the light of the second color may be red light having a peak wavelength in the range of about 610 nm to 650 nm. Still further, the light of the third color may be green light having a peak wavelength in the range of about 510 nm to 550 nm.

The light blocking area BA may include a plurality of row-direction extension regions RER_C extending in the first direction DR1, a plurality of column-direction extension regions CER_C extending in the second direction DR2, and a plurality of crossing regions CSR_C formed by crossing the row-direction extension regions RER_C and the column-direction extension regions CER_C. The row-direction extension regions RER_C may be disposed between two adjacent rows of the plurality of light emitting areas LA, and the column-direction extension regions CER_C may be disposed between two adjacent columns of the plurality of light emitting areas LA. The crossing regions CSR_C may be disposed between adjacent corners of the plurality of light emitting areas LA.

Referring to FIGS. 3 and 4, the display device 1 may further include a plurality of spacers SPC. The plurality of spacers SPC may be provided on one or both of the first substrate 10 and the second substrate 30. For example, the plurality of spacers SPC may be formed on the plurality of color filters 230 of the second substrate 30. In some embodiments, the plurality of spacers SPC may be formed on a color mixing prevention member 370 of the first substrate 10.

The plurality of spacers SPC may be disposed between the first substrate 10 and the second substrate 30. The plurality of spacers SPC may be provided in the air layer AL. The plurality of spacers SPC may be disposed to penetrate the air layer AL. In this case, at least one side surface of the spacer SPC may be exposed to the air layer AL. In an embodiment, the spacer SPC may include a column spacer having a pillar shape.

Referring to FIGS. 1, 2, 3, and 4, the plurality of spacers SPC may be disposed so as to overlap the crossing regions CSR_D of the non-light emitting area NLA and/or the crossing regions CSR_C of the light blocking area BA in the thickness direction. Specifically, the crossing regions CSR_D of the non-light emitting area NLA and the crossing regions CSR_C of the light blocking area BA may be disposed to overlap each other, and the spacers SPC may be disposed between the crossing regions CSR_D of the non-light emitting area NLA and the crossing regions CSR_C of the light blocking area BA.

The plurality of spacers SPC may include a first spacer SPC1, a second spacer SPC2, and a third spacer SPC3.

Referring to FIG. 3, each of the first spacer SPC1, the second spacer SPC2, and the third spacer SPC3 may be disposed to overlap the crossing area CSR_D of the non-display area NDA.

Specifically, the first spacer SPC1 may be disposed in the crossing region CSR_D where the row-direction extension region RER_D passing between the first light emitting area LA1 and the fourth light emitting area LA4 and between the second light emitting area LA2 and the fifth light emitting area LA5 crosses the column-direction extension region CER_D passing between the first light emitting area LA1 and the second light emitting area LA2 and between the fourth light emitting area LA4 and the fifth light emitting area LA5. The second spacer SPC2 may be disposed in the crossing region CSR_D where the row-direction extension region RER_D passing between the third light emitting area LA3 and the sixth light emitting area LA6 and between the second light emitting area LA2 and the fifth light emitting area LA5 crosses the column-direction extension region CER_D passing between the second light emitting area LA2 and the third light emitting area LA3 and between the fifth light emitting area LA5 and the sixth light emitting area LA6. The third spacer SPC3 may be disposed in the crossing region CSR_D where the row-direction extension region RER_D passing between the third light emitting area LA3 and the sixth light emitting area LA6 and between the first light emitting area LA1 and the fourth light emitting area LA4 crosses the column-direction extension region CER_D passing between the third light emitting area LA3 and the first light emitting area LA1 and between the sixth light emitting area LA6 and the fourth light emitting area LA4.

Referring to FIG. 4, each of the first spacer SPC1, the second spacer SPC2, and the third spacer SPC3 may be disposed to overlap the crossing area CSR_C of the second substrate 30.

Specifically, the first spacer SPC1 may be disposed in the crossing region CSR_C where the row-direction extension region RER_C passing between the first light transmitting area TA1 and the fourth light transmitting area TA4 and between the second light transmitting area TA2 and the fifth light transmitting area TA5 crosses the column-direction extension region CER_C passing between the first light transmitting area TA1 and the second light transmitting area TA2 and between the fourth light transmitting area TA4 and the fifth light transmitting area TA5. The second spacer SPC2 may be disposed in the crossing region CSR_C where the row-direction extension region RER_C passing between the third light transmitting area TA3 and the sixth light transmitting area TA6 and between the second light transmitting area TA2 and the fifth light transmitting area TA5 crosses the column-direction extension region CER_C passing between the second light transmitting area TA2 and the third light transmitting area TA3 and between the fifth light transmitting area TA5 and the sixth light transmitting area TA6. The third spacer SPC3 may be disposed in the crossing region CSR_C where the row-direction extension region RER_C passing between the third light transmitting area TA3 and the sixth light transmitting area TA6 and between the first light transmitting area TA1 and the fourth light transmitting area TA4 crosses the column-direction extension region CER_C passing between the third light transmitting area TA3 and the first light transmitting area TA1 and between the sixth light transmitting area TA6 and the fourth light transmitting area TA4.

Referring to FIGS. 3 and 4, the plurality of spacers SPC may be arranged at different intervals from each other. The plurality of spacers SPC may be arranged to have widths corresponding to the widths of the plurality of light emitting areas LA and/or the plurality of light transmitting areas TA in the first direction DR1. In an embodiment, the interval between the first spacer SPC1 and the second spacer SPC2 may be greater than each of the interval between the second spacer SPC2 and the third spacer SPC3 and the interval between the third spacer SPC3 and the first spacer SPC1. The interval between the second spacer SPC2 and the third spacer SPC3 may be greater than the interval between the third spacer SPC3 and the first spacer SPC1. In some embodiments, the interval between the second spacer SPC2 and the third spacer SPC3 may be smaller than the interval between the third spacer SPC3 and the first spacer SPC1. The interval includes an interval in the first direction DR1. In some embodiments, the plurality of spacers SPC may be arranged at regular intervals. In this case, some of the plurality of spacers SPC may be arranged in the crossing regions CSR_D and CSR_C, and others thereof may not be arranged in the crossing regions CSR_D and CSR_C.

Referring to FIGS. 3 and 4, the plurality of spacers SPC may have a pillar shape along the third direction DR3. In a plan view, the plurality of spacers SPC has a circular cross section, but is not limited thereto. In some embodiments, the plurality of spacers SPC may have cross-sections of various shapes such as an ellipse, a rectangle, a square, and a rhombus in a plan view.

Hereinafter, the display device 1 will be described in more detail with reference to FIGS. 5 to 6.

Figure 5:
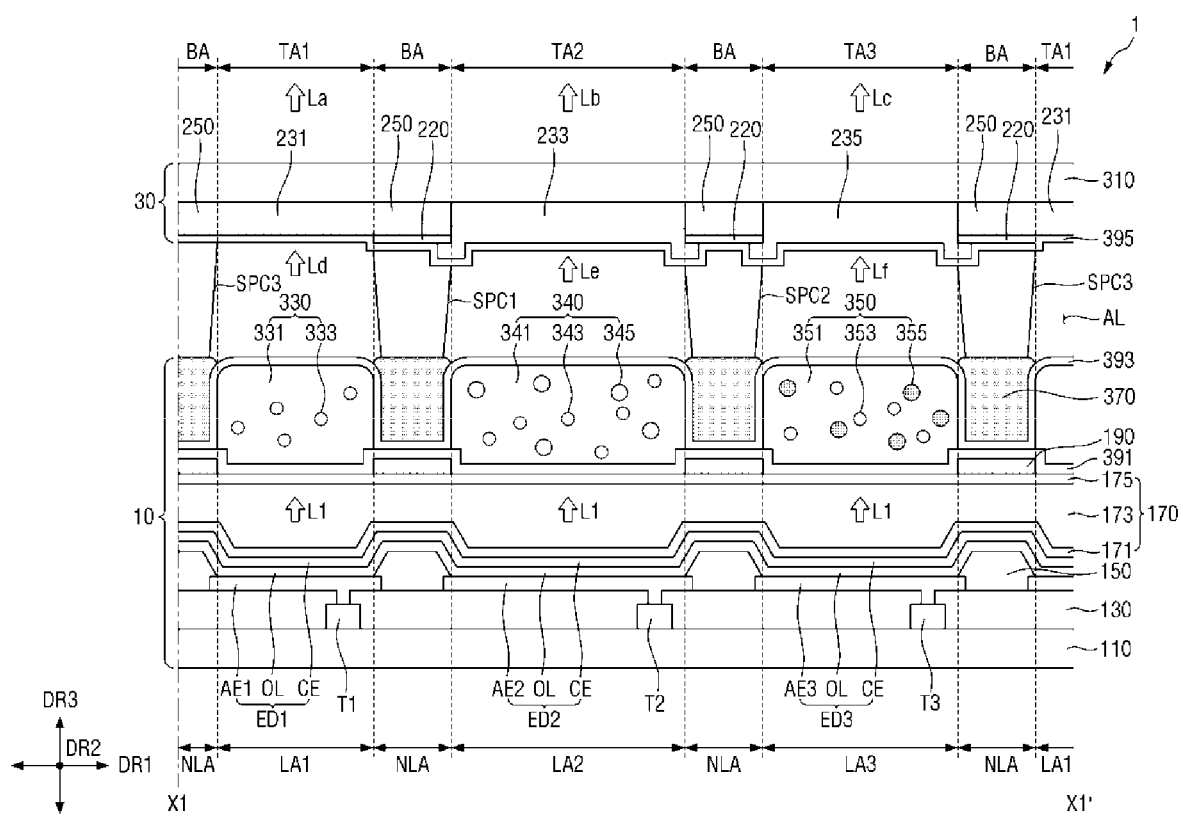
FIG. 5 is a cross-sectional view of a display device according to an embodiment, taken along line X1-X1' of FIGS. 3 and 4.
Figure 6:
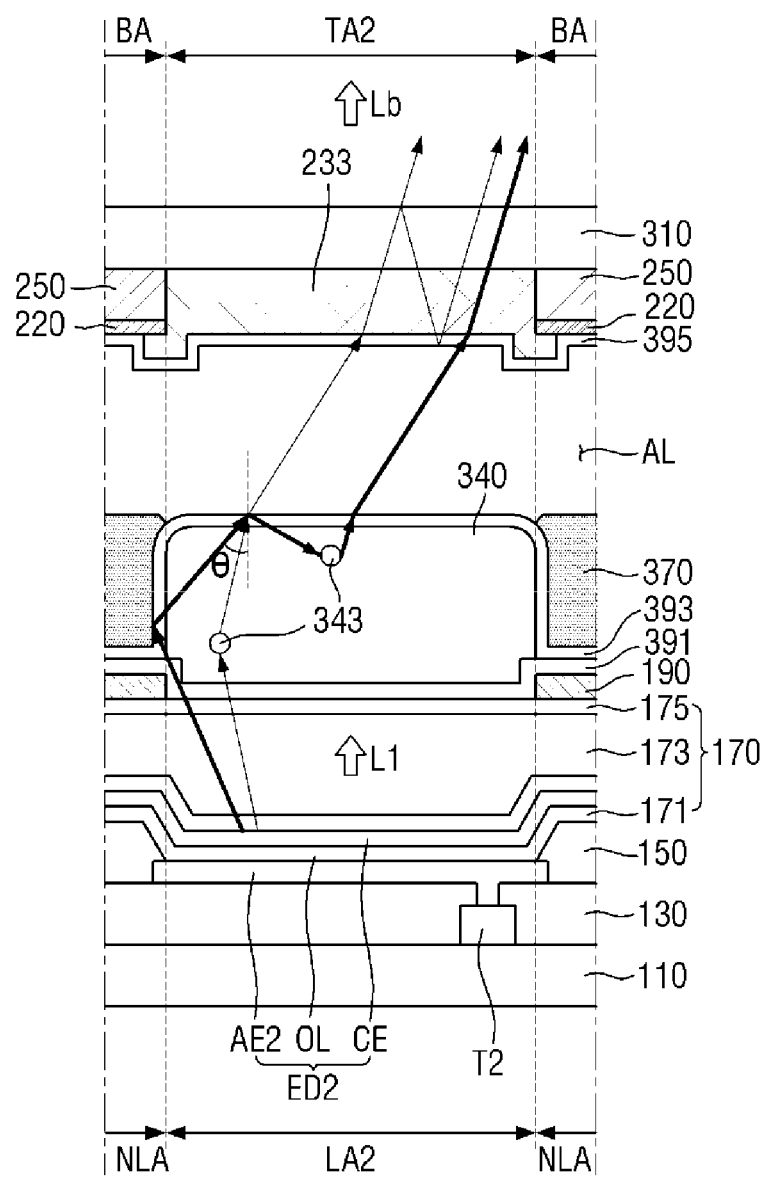
FIG. 6 is an enlarged cross-sectional view of the second light transmitting area of FIG. 5.

FIG. 5 is a cross-sectional view of a display device according to an embodiment, taken along line X1-X1' of FIGS. 3 and 4, and FIG. 6 is an enlarged cross-sectional view of the second light transmitting area of FIG. 5.

Referring to FIGS. 1, 2, 3, 4, 5, and 6, as described above, the display device 1 may include a first substrate 10, a second substrate 30, and an air layer AL. The first substrate 10 may further include a spacer SPC between the first substrate 10 and the second substrate 30.

First, the cross-sectional structures of the first substrate 10 and the second substrate 30 will be described in detail.

Referring to FIGS. 3, 4, 5, and 6, in an embodiment, the plurality of light emitting areas LA and the plurality of light transmitting areas TA may be arranged to completely overlap each other in the thickness direction, and the non-light emitting area NLA and the light blocking area BA may also be arranged to completely overlap each other in the thickness direction, but the present disclosure is not limited thereto. In some embodiments, the plurality of light emitting areas LA of the first substrate 10 and the plurality of light transmitting areas TA of the second substrate 30 may be arranged to partially overlap each other in the thickness direction.

The first substrate 10 may include a first base portion 110, a plurality of switching elements T1, T2, and T3, an insulating layer 130, a plurality of anode electrodes AE1, AE2, and AE3, a pixel defining layer 150, a light emitting layer OL, a cathode electrode CE, a thin film encapsulation layer 170, a panel light blocking member 190, a first capping layer 391, a light transmission pattern 330, a first wavelength conversion pattern 340, a second wavelength conversion pattern 350, a second capping layer 393, and a color mixing prevention member 370.

The first base portion 110 may be disposed over the first light emitting area LA1, the second light emitting area LA2, the third light emitting area LA3, and the non-light emitting area NLA. A plurality of light emitting areas LA and a plurality of non-light emitting areas NLA may be defined in the first base portion 110. The first base portion 110 may include a light-transmitting material. For example, the first base portion 110 may be a glass substrate or a plastic substrate. The first base portion 110 may have flexibility. In some embodiments, the first base portion 110 may further include a separate layer, for example, a buffer layer or an insulating layer, located on a glass substrate or a plastic substrate. The plurality of switching elements T1, T2, and T3, the insulating layer 130, the plurality of anode electrodes AE1, AE2, and AE3, the pixel defining layer 150, the cathode electrode CE, the thin film encapsulation layer 170, and the panel light blocking member 190, which will be described later, may be sequentially stacked on one surface of the first base portion 110 facing the second base portion 310.

The plurality of switching elements T1, T2, and T3 may be arranged on the first base portion 110. The plurality of switching elements T1, T2, and T3 may include a first switching element T1, a second switching element T2, and a third switching element T3, which are arranged in the first light emitting area LA1, the second light emitting area LA2, the third light emitting area LA3, respectively. In some embodiments, the first substrate 10 may further include a switching element disposed in the non-light emitting area NLA. In some embodiments, the first substrate 10 may further include a plurality of signal lines, for example, a gate line, a data line, and a power line, which are arranged on the first base portion 110 and transmit signals to the plurality of switching elements T1, T2, and T3.

The insulating layer 130 may be disposed on the first base portion 110 and/or the plurality of switching elements T1, T2, and T3. The insulating layer 130 may be a planarization layer. For example, the insulating layer 130 may include an acrylic resin, an epoxy resin, an imide resin, or an ester resin. In some embodiments, the insulating layer 130 may include a positive photosensitive material or a negative photosensitive material.

The plurality of anode electrodes AE1, AE2, and AE3 may be arranged on the insulating layer 130. The plurality of anode electrodes AE1, AE2, and AE3 may include a first anode electrode AE1, a second anode electrode AE2 and a third anode electrode AE3, which are arranged in the first light emitting area LA1, the second light emitting area LA2, and the third light emitting area LA3, respectively. As shown in FIG. 5, a part of each of the first anode electrode AE1, the second anode electrode AE2, and the third anode electrode AE3 may be disposed to extend over the adjacent non-light emitting area NLA. The first anode electrode AE1, the second anode electrode AE2, and the third anode electrode AE3 pass through the insulating layer 130 to be connected to the first switching element T1, the second switching element T2, and the third switching element T3, respectively. The first anode electrode AE1, the second anode electrode AE2, and the third anode electrode AE3 may have different sizes from each other. In an embodiment, the size of the first anode electrode AE1 may be smaller than each of the size of the second anode electrode AE2 and the size of the third anode electrode AE3. The size of the second anode electrode AE2 may be larger than the size of the third anode electrode AE3. In some embodiments, the size of the second anode electrode AE2 may be smaller than the size of the third anode electrode AE3. The size may include a width and an area. The width may be a width in the first direction DR1. In some embodiments, the first anode electrode AE1, the second anode electrode AE2, and the third anode electrode AE3 may have the same size.

The pixel defining layer 150 may be disposed on the first anode electrode AE1, the second anode electrode AE2, and the third anode electrode AE3. The pixel defining layer 150 may include a plurality of openings that expose the first anode electrode AE1, the second anode electrode AE2, and the third anode electrode AE3, respectively. The plurality of openings may define the first light emitting area LA1, the second light emitting area LA2, and the third light emitting area LA3. That is, an area of the first anode electrode AE1, not covered by the pixel defining layer 150, may be the first light emitting area LA1. Similarly, an area of the second anode electrode AE2, not covered by the pixel defining layer 150, may be the second light emitting area LA2, and an area of the third anode electrode AE3, not covered by the pixel defining layer 150, may be the third light emitting area LA3. An area in which the pixel defining layer 150 is disposed may be the non-light emitting area NLA. The pixel defining layer 150 may overlap at least one of a color pattern 250, a light blocking member 220, and a color mixing prevention member 370, which will be described later, in the thickness direction (third direction DR3).

The light emitting layer OL may be disposed on the first anode electrode AE1, the second anode electrode AE2, and the third anode electrode AE3. The light emitting layer OL may have a shape of a continuous film formed over the plurality of light emitting areas LA and the non-light emitting areas NLA.

The cathode electrode CE may be disposed on the light emitting layer OL. The cathode electrode CE may have semi-transmissive or transmissive properties.

The first anode electrode AE1, the light emitting layer OL, and the cathode electrode CE may constitute a first light emitting element ED1, the second anode electrode AE1, the light emitting layer OL, and the cathode electrode CE may constitute a second light emitting element ED2, and the third anode electrode AE3, the light emitting layer OL, and the cathode electrode CE may constitute a third light emitting element ED3.

Each of the first light emitting element ED1, the second light emitting element ED2, and the third light emitting element ED3 emits emission light L1. The emission light L1 may be light of a first color. The light of the first color may be blue light, and may have a peak wavelength in the range of about 440 nm to about 480 nm.

In some embodiments, the light emitting layer OL may include a plurality of sub-light emitting layers OL overlapping each other in the thickness direction. The light emitted from the plurality of sub-light emitting layers OL may have a peak wavelength of about less than 610 nm. In this case, the plurality of sub-light emitting layers OL may not emit light having a peak wavelength of 610 nm to 680 nm, for example, red light. In some embodiments, the plurality of sub-light emitting layers OL may emit blue lights, and the blue lights may have different peak wavelengths from each other. For example, the peak wavelength of the first sub-light emitting layer OL may be 440 nm or more and less than 460 nm, and the peak wavelength of the second sub-light emitting layer OL may be 460 nm or more and less than 480 nm. In some embodiments, at least one of the plurality of sub-light emitting layers OL may emit green light. For example, among the plurality of sub-light emitting layers OL, the first sub-light emitting layer OL and the second sub-light emitting layer OL may emit blue light, and the third sub-light emitting layer OL may emit green light.

The thin film encapsulation layer 170 may be disposed on the cathode electrode CE. The thin film encapsulation layer 170 may be disposed over the first light emitting area LA1, the second light emitting area LA2, the third light emitting area LA3, and the non-light emitting area NLA. The thin film encapsulation layer 170 may directly cover the cathode electrode CE. In some embodiments, the first substrate 10 may further include a capping layer between the thin film encapsulation layer 170 and the cathode electrode CE.

The thin film encapsulation layer 170 may include a first encapsulation inorganic layer 171, an encapsulation organic layer 173, and a second encapsulation inorganic layer 175, which are sequentially stacked on the cathode electrode CE.

The panel light blocking member 190 may be disposed on the thin film encapsulation layer 170. The panel light blocking member 190 may be located in the non-light emitting area NLA. In a plan view, the panel light blocking member 190 may be disposed to surround the plurality of light emitting areas LA. The panel light blocking member 190 may prevent the color mixing between adjacent light emitting areas. In some embodiments, the panel light blocking member 190 may be omitted.

The first capping layer 391 may be disposed on the thin film encapsulation layer 170 and/or the panel light blocking member 190. The first capping layer 391 may directly contact the thin film encapsulation layer 170 and the panel light blocking member 190. The first capping layer 391 may be made of an inorganic material. In some embodiments, the first capping layer 391 may be omitted.

The light transmission pattern 330, the first wavelength conversion pattern 340, and the second wavelength conversion pattern 350 may be disposed on the first capping layer 391. The light transmission pattern 330, the first wavelength conversion pattern 340, and the second wavelength conversion pattern 350 may be disposed in the first light emitting area LA1, the second light emitting area LA2, the third light emitting area LA3, respectively.

The light transmission pattern 330 may transmit the emission light L1. The emission light L1 provided from the first light emitting element ED1 may be a mixed light of light blue light and dark blue light, or a mixed light of blue light and green light. A component of the emission light L1 in the blue wavelength band passes through the light transmission pattern 330 and the first color filter 231 and is emitted to the outside of the display device 1. That is, the light passing through the light transmission pattern 330 and incident on the first color filter 231 may have a component substantially the same as or similar to that of the emission light L1, and the first light La emitted from the first light transmitting area TA1 may be blue light.

The light transmission pattern 330 may include a first base resin 331 including an organic material having high light transmittance. The light transmission pattern 330 may further include first scatterers 333 dispersed in the first base resin 331 and having a refractive index different from that of the first base resin 331.

The first wavelength conversion pattern 340 and the second wavelength conversion pattern 350 may convert or shift the peak wavelength of incident light into another specific peak wavelength and emit the incident light having another specific peak wavelength.

The first wavelength conversion pattern 340 may convert the emission light L1 provided from the second light emitting element ED2 into red light having a peak wavelength in the range of about 610 nm to about 650 nm and emit the red light.

The first wavelength conversion pattern 340 may include a second base resin 341 and first wavelength shifters 343. The first wavelength conversion pattern 340 may further include second scatterers 345 dispersed in the second base resin 341 and having a refractive index different from that of the second base resin 341.

The first wavelength shifters 343 may convert the emission light L1 provided by the second light emitting element ED2 into first conversion light Le. The first conversion light Le may be red light. The red light may pass through the second color filter 233 and be emitted to the outside. That is, the second light Lb emitted from the second light transmitting area TA2 may be red light.

A part of the emission light L1 provided from the second light emitting element ED2 may not be converted into red light by the first wavelength shifters 343. A part of the emission light L1 may pass through the first wavelength conversion pattern 340 or may be totally reflected into the first wavelength conversion pattern 340 by the air layer AL, which will be described later.

The second wavelength conversion pattern 350 may convert the emission light L1 provided from the third light emitting element ED3 into green light in the range of about 510 nm to about 550 nm and emit the green light.

The second wavelength conversion pattern 350 may include a third base resin 351 and second wavelength shifters 353. The second wavelength conversion pattern 350 may further include third scatterers 355 dispersed in the third base resin 351 and having a refractive index different from that of the third base resin 351.

The second wavelength shifters 353 may convert the emission light L1 provided by the third light emitting element ED3 into second conversion light Lf. The second conversion light Lf may be green light. The green light may pass through the third color filter 235 and be emitted to the outside. That is, the third light Lc emitted from the third light transmitting area TA3 may be green light.

A part of the emission light L1 provided from the third light emitting element ED3 may not be converted into green light by the second wavelength shifters 353. A part of the emission light L1 may pass through the second wavelength conversion pattern 350 or may be totally reflected into the second wavelength conversion pattern 350 by the air layer AL, which will be described later.

The light transmission pattern 330, the first wavelength conversion pattern 340, and the second wavelength conversion pattern 350 may be formed through exposure and development processes, but the present disclosure is not limited thereto. In some embodiments, the light transmission pattern 330, the first wavelength conversion pattern 340, and the second wavelength conversion pattern 350 may be formed by an inkjet method.

As shown in FIGS. 3 and 4, the light transmission pattern 330, the first wavelength conversion pattern 340, and the second wavelength conversion pattern 350 may be arranged by a manner similar to that in the second color filter 233 and the third color filter 235. For example, the light transmission pattern 330 may be continuously disposed in the first light emitting area LA1, the second light emitting area LA2, and the non-light emitting area NLA between the first light emitting area LA1 and the second light emitting area LA2 so as to have a long stripe shape in the second direction DR2 in a plan view. In some embodiments, the light transmission pattern 330, the first wavelength conversion pattern 340, and the second wavelength conversion pattern 350 may be arranged in the shape of an island pattern for each light emitting area.

In the display device 1, the light transmission pattern 330, the first wavelength conversion pattern 340, and the second wavelength conversion pattern 350 may be arranged on the second base portion 310 to be adjacent to the first light emitting element ED1, the second light emitting element ED2, and the third light emitting element ED3. Accordingly, in the display device 1, light emission components increase as compared with a case where the light transmission pattern 330, the first wavelength conversion pattern 340, and the second wavelength conversion pattern 350 may be arranged on the second base portion 310 are arranged on the first base portion 110, thereby improving light efficiency. Further, the distances of the first light emitting element ED1, the second light emitting element ED2, and the third light emitting element ED3 and the distances of the light transmission pattern 330, the first wavelength conversion pattern 340, and the second wavelength conversion pattern 350 may decrease, thereby preventing the color mixing between adjacent light emitting areas due to the optical paths of the first light emitting element ED1, the second light emitting element ED2, and the third light emitting element ED3.

The second capping layer 393 may be disposed on the light transmission pattern 330, the first wavelength conversion pattern 340, and the second wavelength conversion pattern 350. The second capping layer 393 may cover the light transmission pattern 330, the first wavelength conversion pattern 340, the second wavelength conversion pattern 350, and the first capping layer 391. The light transmission pattern 330, the first wavelength conversion pattern 340, and the second wavelength conversion pattern 350 may be sandwiched between the first capping layer 391 and the second capping layer 393. The second capping layer 393 may directly contact at least one of the light transmission pattern 330, the first wavelength conversion pattern 340, the second wavelength conversion pattern 350, and the first capping layer 391. In an embodiment, the second capping layer 393 may directly contact the first capping layer 391 disposed between the color mixing prevention member 370 and the panel light blocking member 190 and/or between the color mixing prevention member 370 and the thin film encapsulation layer 170 to encapsulate the light transmission pattern 330, the first wavelength conversion pattern 340, and the second wavelength conversion pattern 350. The second capping layer 393 may include a material the same as or similar to that of the first capping layer 391.

The color mixing prevention member 370 may be disposed on the second capping layer 393. The color mixing prevention member 370 may be disposed in the non-light emitting area NLA. The color mixing prevention member 370 may be disposed between the light transmission pattern 330 and the first wavelength conversion pattern 340, between the first wavelength conversion pattern 340 and the second wavelength conversion pattern 350, and between the second wavelength conversion pattern 350 and the light transmission pattern 330. The color mixing preventing member 370 may block light to prevent the color mixing between neighboring light emitting areas. In an embodiment, one side, for example, upper side of the color mixing prevention member 370 may be exposed to the air layer AL.

The air layer AL may be disposed on the color mixing prevention member 370 and/or the second capping layer 393. In an embodiment, the air layer AL may directly contact the color mixing prevention member 370 and/or the second capping layer 393. Details of the air layer AL will be described later.

Referring to FIGS. 5, 6, 7, 8, 9, and 10, the second substrate 30 may include a second base part 310, a plurality of color filters 231, 233, and 235, a color pattern 250, a light blocking member 220, and a third capping layer 395.

The second base part 310 may be disposed over the plurality of light transmitting areas TA and a plurality of the light blocking areas BA. The plurality of light transmitting areas TA and the plurality of light blocking areas BA may be defined in the second base portion 310. The second base part 310 may have light-transmitting properties. For example, the second base portion 310 may be a glass substrate or a plastic substrate. In some embodiments, the second base portion 310 may further include a separate layer, for example, an insulating layer such as an inorganic layer, which is located on a glass substrate or a plastic substrate. The plurality of color filters 231, 233, and 235, the color pattern 250, the light blocking member 220, and the third capping layer 395 may be stacked on one surface of the second base portion 310 facing the first base portion 110. In some embodiments, the second substrate 30 may further include at least one layer, for example, a buffer layer between the second base portion 310 and the plurality of color filters 231, 233, 235 and/or between the second base portion 310 and the color pattern 250.

The plurality of color filters 231, 233, 235 may be disposed on the second base portion 310. The plurality of color filters 231, 233, and 235 may include a first color filter 231, a second color filter 233, and a third color filter 235.

Referring to FIGS. 4, 5, 6, 7, 8, 9, and 10, the first color filter 231 may be disposed in the first light transmitting area TA1 and the fourth light transmitting area TA4, the second color filter 233 may be disposed in the second light transmitting area TA2 and the fifth light transmitting area TA5, and the third color filter 235 may be disposed in the third light transmitting area TA3 and the sixth light transmitting areas TA6.

The first color filter 231 may selectively transmit light of a first color, and may block or absorb light of a second color and light of a third color. The second color filter 233 may selectively transmit light of a second color, and may block or absorb light of a first color and light of a third color. The third color filter 235 may selectively transmit light of a third color, and may block or absorb light of a first color and light of a second color. For example, the light of the first color, the light of the second color, and the light of the third color may be blue light, red light, and green light, respectively.

Referring to FIGS. 4 and 5, a part of the second color filter 233 and a part of the third color filter 235 may be disposed in the light blocking area BA.

One side of the second color filter 233 may be disposed in the light blocking area BA between the first light transmitting area TA1 and the second light transmitting area TA2, and the other side of the second color filter 233 may be disposed in the light blocking area BA between the second light transmitting area TA2 and the third light transmitting area TA3. In this case, one side and the other side of the second color filter 233 may be disposed on the color pattern 250 and/or the light blocking member 220 in the light blocking area BA. The light blocking area BA may include a column-direction extension region CER_C adjacent to the second light transmitting area TA2.

Similarly, one side of the third color filter 235 may be disposed in the light blocking area BA between the second light transmitting area TA2 and the third light transmitting area TA3, and the other side of the third color filter 235 may be disposed in the light blocking area BA between the third light transmitting area TA3 and the first light transmitting area TA1. In this case, one side and the other side of the third color filter 235 may be disposed on the color pattern 250 and/or the light blocking member 220 in the light blocking area BA. The light blocking area BA may include a column-direction extension region CER_C adjacent to the third light transmitting area TA3.

In an embodiment, the other side of the second color filter 233 and one side of the third color filter 235 are disposed to be spaced apart from each other in the first direction DR1, and the light blocking member 220 is exposed between the other side of the second color filter 233 and one side of the third color filter 235, but the present disclosure is not limited thereto. In some embodiments, the other side of the second color filter 233 may be connected to one side of the third color filter 235.

The second and third color filters 233 and 235 may be disposed in the fifth light transmitting area TA5 and the sixth light transmitting area TA6, respectively, in a manner substantially the same as or similar to that in the case of the second light transmitting area TA2 and the third light transmitting area TA3.

Figure 7:
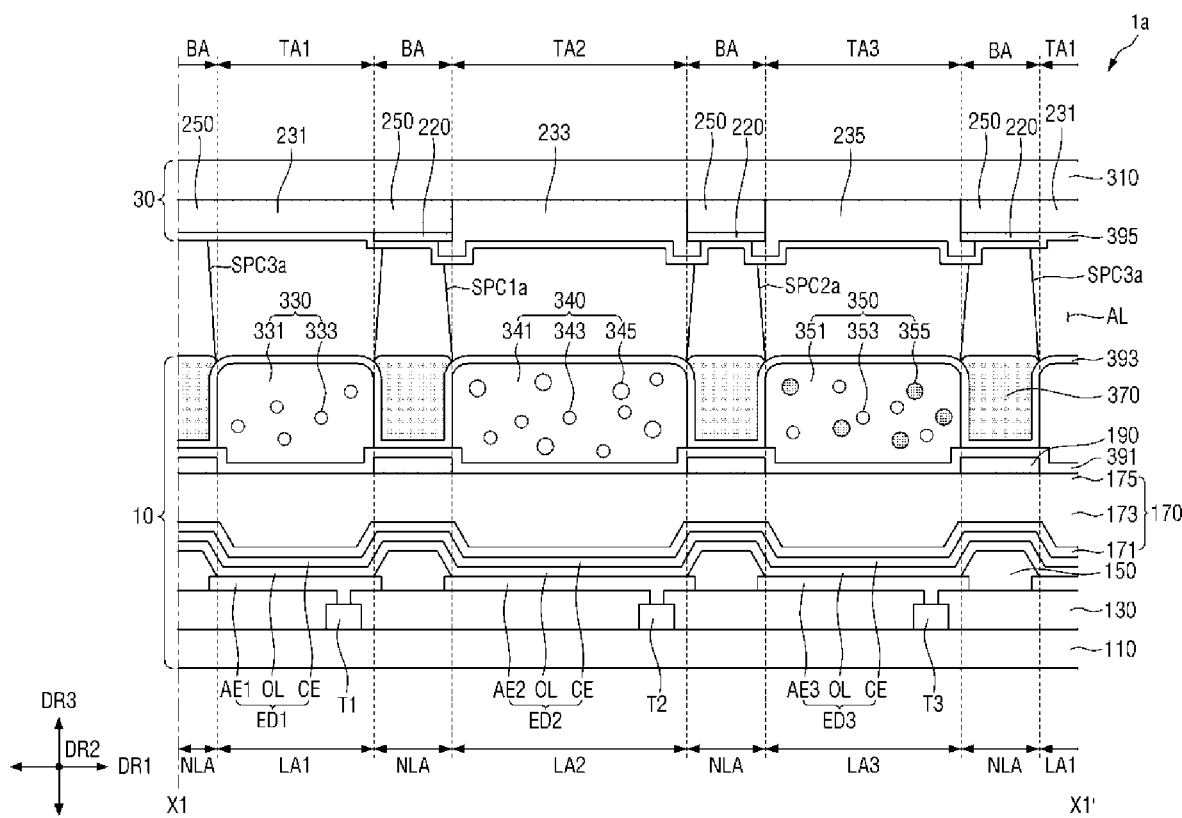
FIG. 7 is a cross-sectional view of a display device according to another embodiment.

Referring to FIGS. 4, 5, and 7, the first color filter 231 disposed in the first light transmitting area TA1 and the first color filter 231 disposed in the fourth light transmitting area TA4 may be spaced apart from each other in the direction DR2. The color pattern 250 may be disposed between the first color filter 231 disposed in the first light transmitting area TA1 and the first color filter 231 disposed in the fourth light transmitting area TA4. The color pattern 250 may overlap the light blocking area BA between the first light transmitting area TA1 and the fourth light transmitting area TA4 in the thickness direction. In an embodiment, the first color filter 231 disposed in the first light transmitting area TA1 may be connected to the first color filter 231 disposed in the fourth light transmitting area TA4 by the color pattern 250.

Figure 8:
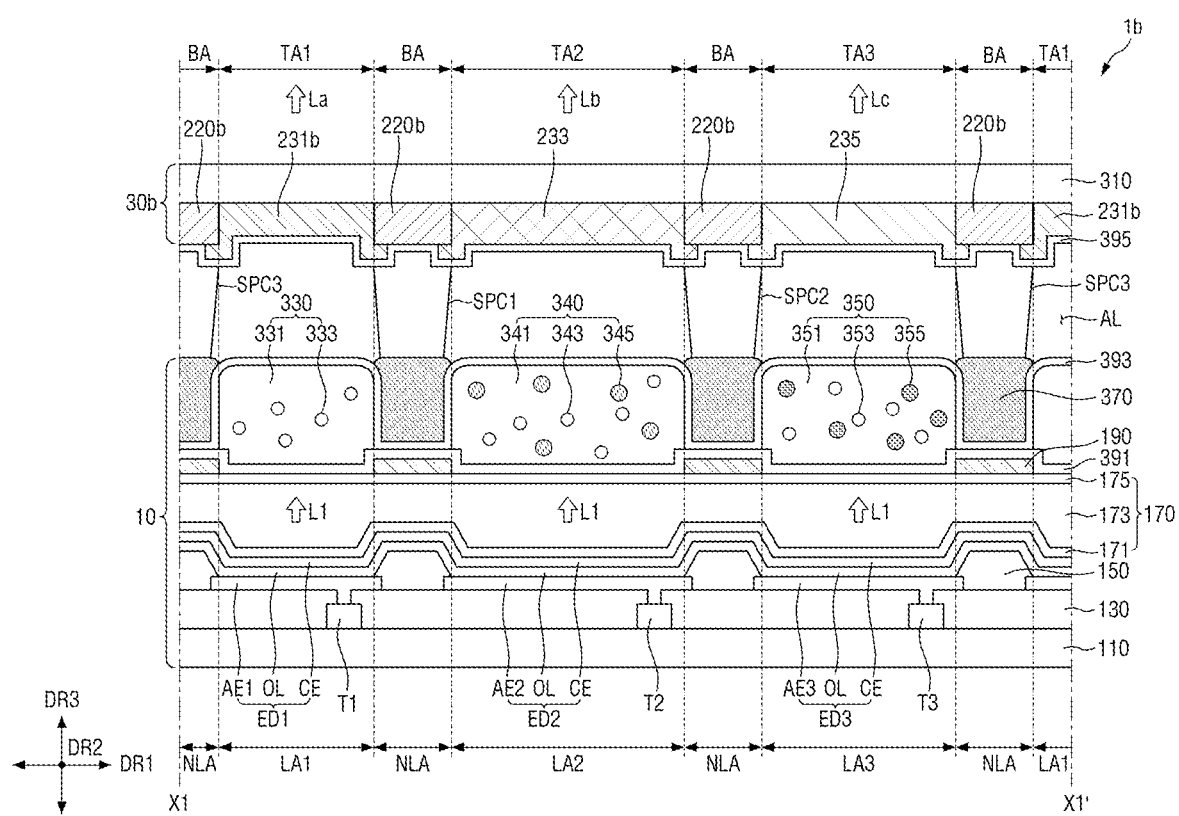
FIG. 8 is a cross-sectional view of a display device according to another embodiment.

Referring to FIGS. 4, 5, 8, and 9, the second color filter 233 may be continuously disposed in the second light transmitting area TA2, the fifth light transmitting area TA5, and the light blocking area BA between the second light transmitting area TA2 and the fifth light transmitting area TA5. In other words, the second color filters 233 disposed in the second light transmitting area TA2, the fifth light transmitting area TA5, and the light blocking area BA between the second light transmitting area TA2 and the fifth light transmitting area TA5 may be integrally connected to each other. A part of the light blocking area BA may include a row-direction extension region RER_D. Referring to FIGS. 4 and 8, in a plan view, the second color filter 233 may be elongated in the second direction DR2 between both column-direction extension regions CER_C adjacent to the second light transmitting area TA2 (fifth light transmitting area TA5). For example, the second color filter 233 may be disposed in a stripe shape extending in the second direction DR2.

Figure 9:
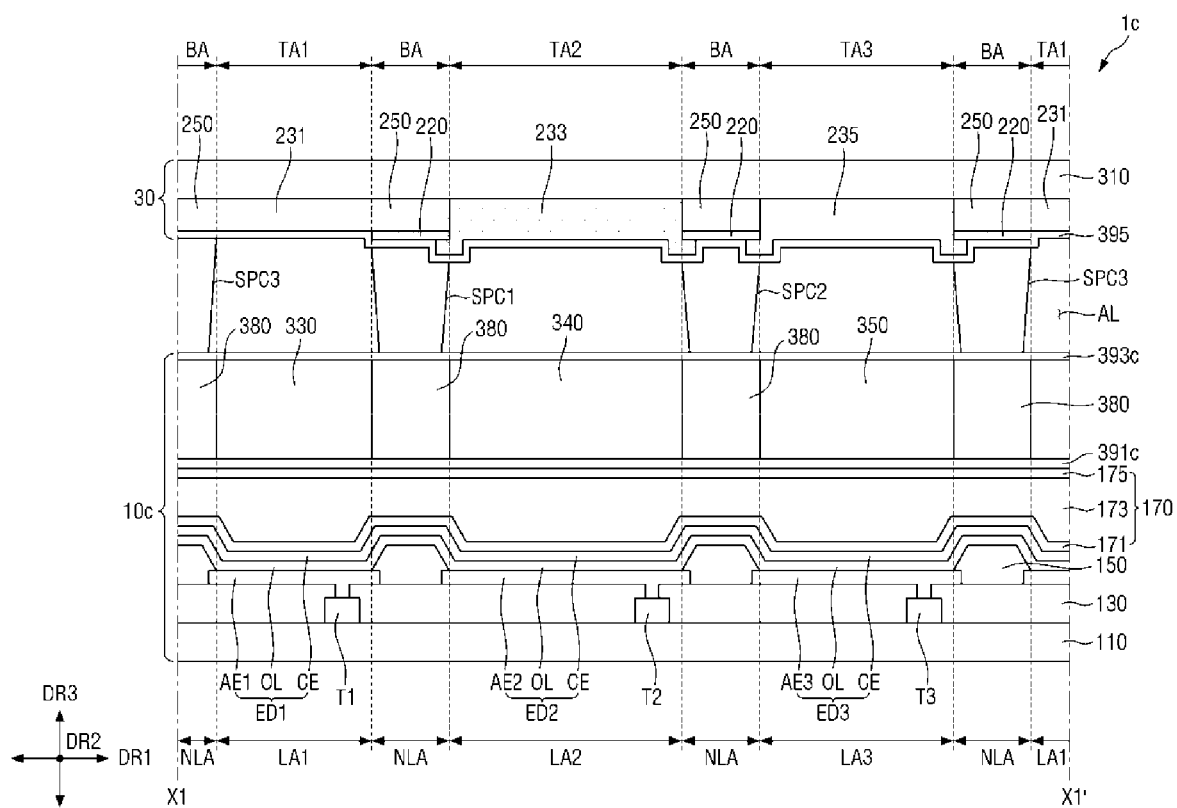
FIG. 9 is a cross-sectional view of a display device according to another embodiment.

The third color filter 235 may be continuously disposed in the third light transmitting area TA3, the sixth light transmitting area TA6, and the light blocking area BA between the third light transmitting area TA3 and the sixth light transmitting area TA6. In other words, the second color filters 233 disposed in the third light transmitting area TA3, the sixth light transmitting area TA6, and the light blocking area BA between the third light transmitting area TA3 and the sixth light transmitting area TA6 may be integrally connected to each other. A part of the light blocking area BA may include a row-direction extension region RER_C. Referring to FIGS. 4 and 9, in a plan view, the third color filter 235 may be elongated in the second direction DR2 between both column-direction extension regions CER_D adjacent to the third light transmitting area TA3 (sixth light transmitting area TA6). For example, the third color filter 235 may be disposed in a stripe shape extending in the second direction DR2.

In some embodiments, each of the second color filter 233 and the third color filter 235 may be disposed in an island pattern in the plurality of light transmitting areas TA.

The color pattern 250 is disposed on the second base portion 310. The color pattern 250 may be disposed to directly contact one surface of the second base portion 310 or the buffer layer on the one surface thereof. The color pattern 250 may be disposed in the light blocking area BA. Referring to FIG. 4, the color pattern 250 may be disposed to have a lattice shape in the light blocking area BA. In an embodiment, as described above, the color pattern 250 may be integrally connected with the first color filter 231.

The color pattern 250 may include a blue colorant such as a blue dye or a blue pigment. The color pattern 250 may absorb a part of light flowing into the second substrate 30 from the outside of the display device 1, thereby reducing reflected light caused by external light and color distortion due to the reflected light.

The color pattern 250 may be made of the same material as the first color filter 231, and may be formed at the same time in the process of forming the first color filter 231. In an embodiment, the thickness of the color pattern 250 in the third direction DR3 may be the same as the thickness of the first color filter 231 in the third direction DR3.

The light blocking member 220 may be disposed on the second base portion 310. In an embodiment, the light blocking member 220 may be disposed on the color pattern 250. Accordingly, the light blocking member 220 may not directly contact one surface of the second base portion 310. The light blocking member 220 may be disposed in the light blocking area BA. Referring to FIG. 4, the light blocking member 220 may be disposed to have a lattice shape in the column-direction extension region CER_D, the row-direction extension region RER_D, and the crossing area CSR_D of the light blocking area BA. The light blocking member 220 may include an organic light blocking material. The light blocking member 220 may block the transmission of light, thereby reducing the reflection of external light and the color mixing between adjacent light transmitting areas TA.

The third capping layer 395 is disposed on the light blocking member 220, the color pattern 250 and/or the plurality of color filters 231, 233, 235. The third capping layer 395 covers the light blocking member 220, the color pattern 250 and/or the plurality of color filters 231, 233, 235. In an embodiment, the third capping layer 395 may directly contact the light blocking member 220, the color pattern 250, and the plurality of color filters 231, 233, and 235.

Referring to FIGS. 2 and 5, 6, 7, 8, 9, and 10, as described above, the display device 1 includes an air layer AL disposed between the first substrate 10 and the second substrate 30. The display device 1 may further include a spacer disposed between the first substrate 10 and the second substrate 30 and maintaining the thickness of the air layer AL.

Hereinafter, for convenience of description, the configuration and arrangement of the air layer AL and the spacer will be described based on the plurality of light transmitting areas TA and the plurality of light blocking areas BA. However, the present disclosure is not limited thereto. The following light transmitting areas TA and light-blocking areas BA may be replaced with the light emitting areas LA and the non-light emitting areas NLA, respectively.

The air layer AL may be disposed in the light transmitting area TA. The air layer AL may be disposed over the light transmitting area TA and the light blocking area BA. In some embodiments, the air layer AL may be disposed only in the light transmitting area TA.

The air layer AL may be disposed between the light transmission pattern 330 and the first color filter 231, between the first wavelength conversion pattern 340 and the second color filter 233, and/or between the second wavelength conversion pattern 350 and the third color patterns 250. In this case, the air layer AL may be disposed between the second capping layer 393 and the third capping layer 395. The air layer AL may be disposed between the second capping layer 393 and the color mixing prevention member 370 and/or between the light blocking member 220 and the color mixing prevention member 370.

The air layer AL may have a lower refractive index than the light transmission pattern 330, the first wavelength conversion pattern 340, the second wavelength conversion pattern 350, and/or the plurality of color filters 231, 233, and 235. For example, the difference in refractive index between the air layer AL and the light transmission pattern 330, the difference in refractive index between the air layer AL and the first wavelength conversion pattern 340, the difference in refractive index between the air layer AL and the second wavelength conversion pattern 350, and/or the difference in refractive index between the air layer AL and the plurality of color filters 231, 233, and 235 may be about 0.4 to 1.0. In this case, the refractive indexes of the plurality of color filters 231, 233, and 235 may be smaller than those of the light transmission pattern 330, the first wavelength conversion pattern 340, and the second wavelength conversion pattern 350. For another example, the difference in refractive index between the air layer AL and the plurality of color filters 231, 233, 235 may be 0.4 to 1.0, and the difference in refractive index between the air layer AL and the light transmitting pattern 330, the difference in refractive index between the air layer AL and the first wavelength conversion pattern 340, and/or the difference in refractive index between the air layer AL and the second wavelength conversion pattern 350 may be 0.6 to 1.0. For another example, the difference in refractive index between the air layer AL and the plurality of color filters 231, 233, 235 may be 0.37 to 1.0, and the difference in refractive index between the air layer AL and the light transmitting pattern 330, the difference in refractive index between the air layer AL and the first wavelength conversion pattern 340, and/or the difference in refractive index between the air layer AL and the second wavelength conversion pattern 350 may be 0.57 to 1.0. For another example, the refractive index of the air layer AL may be about 1.0, the refractive index of each of the light transmission pattern 330, the first wavelength conversion pattern 340, and the second wavelength conversion pattern 350 may be about 1.7 to 1.9, the refractive index of the color filter may be about 1.5 to 1.7, and the refractive index of the first base portion 110 may be about 1.5 to 1.9.

In some embodiments, the refractive indices of the light transmission pattern 330, the first wavelength conversion pattern 340, and the second wavelength conversion pattern 350 may be the same as or different from each other.

In some embodiments, the refractive index of the second capping layer 393 may be the same as that of each of the light transmission pattern 330, the first wavelength conversion pattern 340, and the second wavelength conversion pattern 350. In some embodiments, the refractive index of the second capping layer 393 may be different from that of each of the light transmission pattern 330, the first wavelength conversion pattern 340, and the second wavelength conversion pattern 350. For example, the refractive index of the second capping layer 393 may be lower or higher than that of each of the light transmission pattern 330, the first wavelength conversion pattern 340, and the second wavelength conversion pattern 350.

In some embodiments, the refractive index of the second capping layer 393 may be the same as the refractive index of the first capping layer 391. In some embodiments, the refractive index of the second capping layer 393 may be different from the refractive index of the first capping layer 391. For example, the refractive index of the second capping layer 393 may be lower or higher than the refractive index of the first capping layer 391.

Referring to FIGS. 5 and 6, the display device 1 may improve light efficiency by recycling the emission light L1 whose wavelength has not been converted. Since the path of light passing through the second wavelength conversion pattern 350, the air layer AL, and the third color filter 235 may be substantially the same or similar to the path of light passing through the first wavelength conversion pattern 340, the air layer AL, and the second color filter 233, hereinafter, light passing through the first wavelength conversion pattern 340, the air layer AL, and the second color filter 233 will be mainly described.

A part of the emission light L1 incident on the first wavelength conversion pattern 340 is converted in wavelength by the first wavelength shifter 343, whereas another part of the emission light L1 incident on the first wavelength conversion pattern 340 may be absorbed by the second color filter 233 by passing through the first wavelength conversion pattern 340 without converting the wavelength. Accordingly, light loss may occur, and efficiency of the display device 1 may deteriorate.

In the display device 1 according to an embodiment, the air layer AL may be disposed between the light transmission pattern 330 and the first color pattern 250, between the first wavelength conversion pattern 340 and the second color filter 233, and/or between the second wavelength conversion pattern 350 and the third color filter 235 to improve light efficiency. As shown in FIG. 6, the air layer AL may increase the total reflection at the interface between the first wavelength conversion pattern 340 and the air layer AL by reducing the critical angle θ for total reflection. The air layer AL may totally reflect the light whose wavelength has not yet been converted by the first wavelength conversion pattern 340, for example, blue light, toward the inside of the first wavelength conversion pattern 340 and/or the second base portion 310, and the reflected emission light L1 may be incident on the first wavelength shifters 343 again to covert the wavelength. Then, the light whose wavelength has been converted, for example, red light may be emitted to the outside of the first wavelength conversion pattern 340. The same or similar total reflection as above may be performed by the air layer AL on the second wavelength conversion pattern 350.

That is, in the display device 1 according to an embodiment, the efficiency of the display device 1 may be greatly improved by recycling the emission light L1 whose wavelength has not been converted by the first wavelength conversion pattern 340 and the second wavelength conversion pattern 350.

Moreover, in the display device 1 according to an embodiment, the efficiency of the display device 1 may be greatly improved by reflecting the light having been totally reflected to the inside of the display device 1 at the interface between the outside and the second base portion 310 again.

Further, in the display device 1 according to an embodiment, a separate filler is not required between the first substrate 10 and the second substrate 30, thereby preventing defects due to diffusion defects or non-uniformities of the filler and improving degree of freedom in pixel design.

Referring to FIGS. 5, 6, 7, 8, and 9, a plurality of spacers SPC may be disposed between the first substrate 10 and the second substrate 30. The plurality of spacers SPC may be disposed to pass through the air layer AL. For example, the height of each of the plurality of spacers SPC in the third direction DR3 may be about 1.0 μm to 5.0 μm. In an embodiment, each of the plurality of spacers SPC may have a tapered pillar shape whose diameter decreases from the second substrate 30 toward the first substrate 10, but the shape thereof is not limited thereto. In some embodiments, the widths of the plurality of spacers SPC in the first direction DR1 and/or the second direction DR2 may be constant. The plurality of spacers SPC may maintain the thickness of the air layer AL between the first substrate 10 and the color conversion pattern.

The plurality of spacers SPC may be disposed between the color pattern 250 and the color mixing prevention member 370 and/or between the light blocking member 220 and the color mixing prevention member 370. In this case, one end of each of the plurality of spacers SPC may be disposed directly on the third capping layer 395 on the light blocking member 220, and the other end thereof may be disposed directly on the color mixing prevention member 370.

The plurality of spacers SPC may be disposed in the light blocking area BA. Accordingly, the plurality of spacers SPC may overlap at least one of the color pattern 250, the light blocking member 220, the color mixing prevention member 370, the panel light blocking member 190, and/or the pixel defining layer 150 in the thickness direction.

The plurality of spacers SPC may be disposed to overlap some of the plurality of color filters 231, 233, and 235 in the thickness direction.

The first spacer SPC1 disposed in the light blocking area BA between the first light transmitting area TA1 and the second light transmitting area TA2 may be disposed to overlap one sides of the color pattern 250, the light blocking member 220, and the second color filter 233 in the thickness direction. That is, one end of the first spacer SPC1 facing the second substrate 30 may be disposed over the color pattern 250 and the second color filter 233 (the light blocking member 220 and the second color filter 233). At one end of the first spacer SPC1, one step may be formed according to a height difference between one side of the second color filter 233 and the light blocking member 220.

The second spacer SPC2 disposed in the light blocking area BA between the second light transmitting area TA2 and the third light transmitting area TA3 may be disposed to overlap the other sides of the color pattern 250, the light blocking member 220, and the second color filter 233 and one side of the third color filter 235 in the thickness direction. That is, one end of the second spacer SPC2 facing the second substrate 30 may be disposed over the other side of the second color filter 233, the color pattern 250, and one side of the third color filter 235 (the other side of the second color filter 233, the light blocking member 220 and one side of the third color filter 235). At one end of the second spacer SPC2, two steps may be formed according to a height difference between the other side of the second color filter 233 and the light blocking member 220 and a height difference between one side of the third color filter 235 and the light blocking member 220. In this case, a protrusion protruding toward the second base portion 310 may be formed between the two steps.

The third spacer SPC3 disposed in the light blocking area BA between the third light transmitting area TA3 and the first light transmitting area TA1 may be disposed to overlap the other sides of the color pattern 250, the light blocking member 220, and the third color filter 235 in the thickness direction. That is, one end of the third spacer SPC3 facing the second substrate 30 may be disposed over the other side of the third color filter 235 and the color pattern 250 (the other side of the third color filter 235 and the light blocking member 220. At one end of the third spacer SPC3, one step may be formed according to a height difference between one side of the first color filter 231 and the light blocking member 220.

The step and/or protrusion of each of the first spacer SPC1, the second spacer SPC2, and the third spacer SPC3 may have a shape extending in the second direction DR2 as the second color filter 233 and the third color filter 235 are disposed in a stripe shape extending in the second direction DR2.

In some embodiments, the plurality of color filters 231, 233, 235 are arranged to completely cover the neighboring color pattern 250 and/or the light blocking member 220, respectively, and each end of the plurality of spacers SPC may be formed flat.

The plurality of spacers SPC may include a transparent material. In an embodiment, the plurality of spacers SPC may be made of a transparent organic insulating material. In some embodiments, the plurality of spacers SPC may include at least one of a material absorbing at least a part of light, a light reflective material, and a light scattering material. For example, the plurality of spacers SPC may include a black matrix. As another example, the plurality of spacers SPC may include an opaque inorganic insulating material such as CrOx and/or MoOx, or an opaque organic insulating material such as black resin. As another example, the plurality of spacers SPC may include a material layer having high light reflectance, for example, a metal layer. The metal layer may include silver, magnesium, aluminum, platinum, palladium, gold, nickel neodymium, iridium, chromium, or an alloy thereof. In some embodiments, the plurality of spacers SPC may include a plurality of layers, and at least one of the plurality of layers may be a metal layer.

In an embodiment, all of the first spacer SPC1, the second spacer SPC2, and the third spacer SPC3 may be made of a transparent material. In some embodiments, all of the first spacer SPC1, the second spacer SPC2, and the third spacer SPC3 may be made of at least one of a material absorbing at least a part of light, a light reflective material, and a light scattering material. In some embodiments, at least one of the first spacer SPC1, the second spacer SPC2, and the third spacer SPC3 may be made of a transparent material, and the others thereof may be made of a material absorbing at least a part of light, a light reflective material, and a light scattering material. For example, the first spacer SPC1 and third spacer SPC3 disposed adjacent to the first color filter 231 may be made of at least one of a material absorbing at least a part of light, a light reflective material, and a light scattering material, and the second spacer SPC2 may be made of a transparent material. In some embodiments, the light transmittance of the second spacer SPC2 may be greater than that of the first spacer SPC1 and/or the third spacer SPC3. In some embodiments, the light absorbance and/or light reflectance of the first spacer SPC1 and/or the third spacer SPC3 may be greater than those of the second spacer SPC2.

In an embodiment, the plurality of spacers SPC may be formed on the second substrate 30. In this case, one end of each of the plurality of spacers SPC may be coupled to the third capping layer 395 of the second substrate 30, and the other end thereof may contact the color mixing prevention member 370 of the first substrate 10. In some embodiments, the plurality of spacers SPC may also be formed on the first substrate 10.

FIG. 7 is a cross-sectional view of a display device according to another embodiment.

The embodiment of FIG. 7 is different from the embodiment of FIGS. 1, 2, 3, 4, 5, and 6 in that a first spacer SPC1a, a second spacer SPC2a, and a third spacer SPC3a are formed on the first substrate 10.

Referring to FIG. 7, one end of each of the first spacer SPC1a, the second spacer SPC2a, and the third spacer SPC3a facing the second substrate 30 may be in contact with the second substrate 30, and the other end thereof facing the first substrate 10 may be coupled to the first substrate 10. Specifically, one end of each of the first spacer SPC1a, the second spacer SPC2a, and the third spacer SPC3a may be in contact with the third capping layer 395, and the other end of each of the first spacer SPC1a, the second spacer SPC2a, and the third spacer SPC3a may be coupled to the color mixing prevention member 370.

In an embodiment, each of the first spacer SPC1a, the second spacer SPC2a, and the third spacer SPC3a may have a tapered pillar shape whose diameter decreases from the first substrate 10 toward the second substrate 30 along the third direction DR3, but the shape thereof is not limited thereto. In some embodiments, each of the first spacer SPC1a, the second spacer SPC2a, and the third spacer SPC3a may include a wall having a predetermined height in the third direction DR3, and the wall may include both side surfaces inclined such that the widths thereof in the first direction DR1 and/or the second direction DR2 decrease toward the second substrate 30.

In some embodiments, each of the first spacer SPC1a, the second spacer SPC2a, and the third spacer SPC3a may include at least one of a light reflective material and a light scattering material. The light having passed through the light transmission pattern 330, the first wavelength conversion pattern 340 and/or the second wavelength conversion pattern 350 may be reflected toward the second substrate 30 by the inclined outer circumferential surface or both side surfaces of each of the first spacer SPC1a, the second spacer SPC2a, and the third spacer SPC3a.

In some embodiments, the first spacer SPC1a, the second spacer SPC2a, and the third spacer SPC3a may be made of the same material as the color mixing prevention member 370. The material may include an organic light blocking material. In this case, the first spacer SPC1a, the second spacer SPC2a, and the third spacer SPC3a may be formed together with the color mixing prevention member 370. For example, the first spacer SPC1a, the second spacer SPC2a, and the third spacer SPC3a may be integrally formed with the color mixing prevention member 370 by using a halftone etching method or the like.

The embodiment of FIG. 7 is substantially the same as or similar to the embodiment of FIGS. 1, 2, 3, 4, 5 and 6 except that the first spacer SPC1a, the second spacer SPC2a, and the third spacer SPC3a are formed on the first substrate 10. Therefore, hereinafter, redundant descriptions will be omitted.

FIG. 8 is a cross-sectional view of a display device according to another embodiment.

The embodiment of FIG. 8 is different from the embodiment of FIGS. 1, 2, 3, 4, 5, and 6 in that the color filter 250 is not disposed on the second substrate 30.

Referring to FIG. 8, the second substrate 30 may include a second base portion 310, a light blocking member 220b, a first color filter 231b, a second color filter 233, and a third color filter 235, and a third capping layer 395.

The light blocking member 220b may be disposed in the light blocking area BA between the first color filter 231b and the second color filter 233, between the second color filter 233 and the third color filter 235, and between the third color filter 235 and the first color filter 231b.

Unlike the embodiment of FIGS. 1, 2, 3, 4, 5, and 6, in the embodiment of FIG. 8, the color pattern 30 is not disposed in the light blocking area BA. Accordingly, only the light blocking member 220b may be disposed between the first color filter 231b and the second color filter 233, between the second color filter 233 and the third color filter 235, and between the third color filter 235 and the first color filter 231b.

The light blocking member 220b may directly contact the second base portion 310. In some embodiments, the light blocking member 220b may be disposed to directly contact at least one other layer, for example, a buffer layer on the second base portion 310.

Similarly to the second color filter 233 and the third color filter 235, the first color filter 231b may be disposed over the light blocking member 220b in the light blocking area BA. Specifically, one side of the first color filter 231b may be disposed on the light blocking member 220b disposed in the light blocking area BA between the third light transmitting area TA3 and the first light transmitting area TA1, and the other side of the first color filter 231b may be disposed on the light blocking member 220b disposed in the light blocking area BA between the first light transmitting area TA1 and the second light transmitting area TA2.

In the embodiment of FIG. 8, the first color filter 231b, the second color filter 233 and the third color filter 235 may be spaced apart from each other in the first direction DR1, and the light blocking member 220b may be disposed to be exposed between the first color filter 231b and the second color filter 233, between the second color filter 233 and the third color filter 235, and between the third color filter 235 and the first color filter, but the present disclosure is not limited thereto. In some embodiments, one side of the first color filter 231b and the other side of the third color filter 235, the other side of the first color filter 231b and one side of the second color filter 233, and the other side of the second color filter 233 and one side of the third color filter 235 may be arranged in the light blocking layers to be connected to each other, respectively.

Although it is illustrated in FIG. 8 that a plurality of spacers SPC is formed on the second substrate 30, one ends of the plurality of spacers SPC are coupled to the third capping layer 395, and the other ends thereof are in contact with the second capping layer 393, the present disclosure is not limited thereto. In some embodiments, the plurality of spacers SPC may be formed on the first substrate 10, so that one end of each of the plurality of spacers SPC may be in contact with the third capping layer 395, and the other end of the plurality of the spacers SPC thereof may be coupled to the second capping layer 393.

The embodiment of FIG. 8 is substantially the same as or similar to the embodiment of FIGS. 1, 2, 3, 4, 5, and 6 except that the color pattern 250 is not disposed on the second substrate 30. Therefore, hereinafter, redundant descriptions will be omitted.

FIG. 9 is a cross-sectional view of a display device according to another embodiment.

The embodiment of FIG. 9 is different from the embodiment of FIGS. 1, 2, 3, 4, 5, and 6 in that partition walls 380 are disposed instead of the color mixing prevention member 370 and the panel light blocking member 190.

Referring to FIG. 9, the first substrate 10 may include a first base portion 110, a plurality of switching elements T1, T2, and T3, an insulating layer 130, a plurality of anode electrodes AE1, AE2, AE3, a pixel defining layer 150, a light emitting layer OL, a cathode electrode CE, a thin film encapsulation layer 170, a first capping layer 391c, a partition wall 380, a light transmission pattern 330, a first wavelength conversion pattern 340, a second wavelength conversion pattern 350, and a second capping layer 393c.

The first capping layer 391c may be disposed on the thin film encapsulation layer 170. The first capping layer 391c may be directly disposed on a second encapsulation inorganic layer 175 of the thin film encapsulation layer 170.

The partition wall 380 may be disposed on the first capping layer 391c. The partition wall 380 may be directly disposed on the first capping layer 391c. The partition wall 380 may be disposed in the non-light emitting area NLA. The partition wall 380 may be disposed to overlap the light blocking area BA in the thickness direction. The partition wall 380 may be disposed to surround the plurality of light emitting areas LA in a plan view. Specifically, referring to FIG. 3, the partition wall 380 may be disposed in a lattice shape surrounding the first light emitting area LA1, the second light emitting area LA2, the third light emitting area LA3, the fourth light emitting area LA4, the fifth light emitting area LA5, and the sixth light emitting area LA6. The partition wall 380 may partition a space in which the light transmission pattern 330, the first wavelength conversion pattern 340, and the second wavelength conversion pattern 350 are disposed according to the plurality of light emitting areas LA. In some embodiments, the first capping layer 391c may be omitted, and the partition wall 380 may be directly disposed on the second encapsulating inorganic layer 175 of the thin film encapsulation layer 170.

When the light transmission pattern 330, the first wavelength conversion pattern 340, and the second wavelength conversion pattern 350 are formed by an inkjet method using an ink composition, the partition wall 380 may serve as a guide for stably placing the ink composition at a desired position.

The partition wall 380 may include a photosensitive organic material, but is not limited thereto. In some embodiments, the photosensitive organic material may be a negative photosensitive material.

The partition wall 380 may further include a light blocking material. The partition wall 380 may be disposed in the light blocking area BA to prevent the color mixing between adjacent light emitting areas and/or light transmitting areas.

The light transmission pattern 330, the first wavelength conversion pattern 340, and the second wavelength conversion pattern 350 are disposed in the first light transmission area TA1, the second light transmission area TA2, and the third light transmission area TA3, respectively, in the space partitioned by the partition wall 380.

The second capping layer 393c may be disposed on the partition wall 380, the light transmission pattern 330, the first wavelength conversion pattern 340, and the second wavelength conversion pattern 350. That is, the partition wall 380, the light transmission pattern 330, the first wavelength conversion pattern 340 and the second wavelength conversion pattern 350 may be sandwiched between the first capping layer 391c and the second capping layer 393c. In some embodiments, the light transmission pattern 330, the first wavelength conversion pattern 340, and the second wavelength conversion pattern 350 may directly contact the side surface of the partition wall 380. In some embodiments, the partition wall 380 may be covered by the second capping layer 393c not to be directly exposed to the air layer AL.

One end of each of the plurality of spacers SPC may be coupled to the third capping layer 395, and the other end of each of the plurality of spacers SPC thereof may be in contact with the second capping layer 393c. In some embodiments, some of the plurality of spacers SPC may be disposed such that the other ends thereof are spaced apart from the second capping layer 393c in the third direction DR3. In some embodiments, the plurality of spacers SPC may be formed on the first substrate 10, so that one ends of the plurality of spacers SPC are in contact with the third capping layer 395, and the other ends thereof are coupled to the second capping layer 393c.

The embodiment of FIG. 9 is substantially the same as or similar to the embodiment of FIGS. 1, 2, 3, 4, 5, and 6 except that the partition walls 380 are disposed instead of the color mixing prevention member 370 and the panel light blocking member 190. Therefore, hereinafter, redundant descriptions will be omitted.

Figure 10:
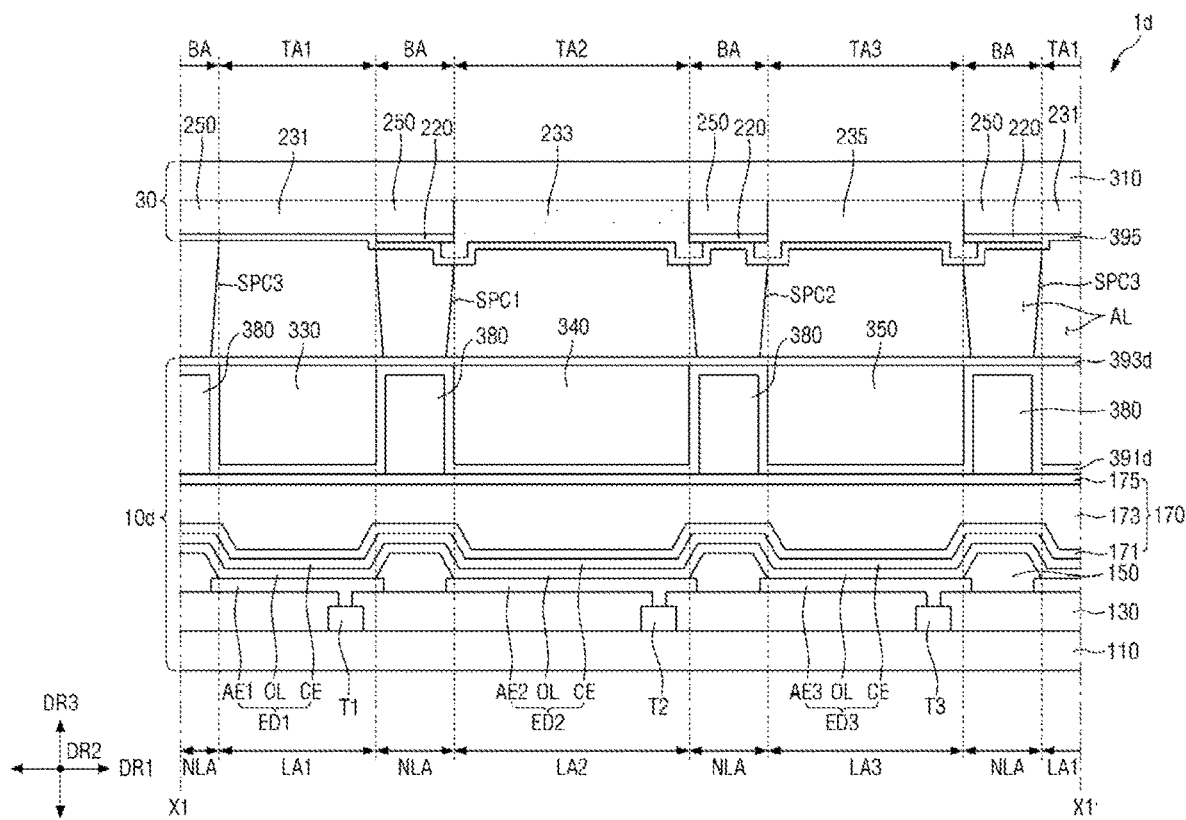
FIG. 10 is a cross-sectional view of a display device according to another embodiment.

FIG. 10 is a cross-sectional view of a display device according to another embodiment.

The embodiment of FIG. 10 is different from the embodiment of FIG. 9 in the arrangement of the partition wall 380, the first capping layer 391d, and the second capping layer 393d.

Referring to FIG. 10, the partition wall 380 may be disposed on the thin film encapsulation layer 170. The partition wall 380 may be directly disposed on the second encapsulation inorganic layer 175 of the thin film encapsulation layer 170.

The first capping layer 391d may be disposed on the partition wall 380. Specifically, the first capping layer 391d may be disposed to cover the thin film encapsulation layer 170 exposed the partition walls 380. Accordingly, the upper surface of the partition wall 380 facing the second substrate 30 and the side surfaces thereof connected to the upper surface thereof may be covered by the first capping layer 391d. Accordingly, the light transmission pattern 330, the first wavelength conversion pattern 340, and the second wavelength conversion pattern 350 may not directly contact the partition wall 380.

The light transmission pattern 330, the first wavelength conversion pattern 340, and the second wavelength conversion pattern 350 may be disposed on the first capping layer 391d. As described above with reference to FIG. 9, the light transmission pattern 330, the first wavelength conversion pattern 340, and the second wavelength conversion pattern 350 are disposed in the spaces partitioned by the partition wall 380.

The second capping layer 393d may be disposed on the first capping layer 391d, the light transmission pattern 330, the first wavelength conversion pattern 340, and the second wavelength conversion pattern 350. The second capping layer 393d may cover the first capping layer 391d, the light transmission pattern 330, the first wavelength conversion pattern 340 and the second wavelength conversion pattern 350. The light transmission pattern 330, the first wavelength conversion pattern 340, and the second wavelength conversion pattern 350 may be sandwiched between the first capping layer 391*d* and the second capping layer 393*d*. The second capping layer 393*d* may directly contact the light transmission pattern 330, the first wavelength conversion pattern 340, and the second wavelength conversion pattern 350. The second capping layer 393*d* may directly contact the first capping layer 391*d*. The second capping layer 393*d* may directly contact the first capping layer 391*d* between the partition wall 380 and the spacer to seal the first wavelength conversion pattern 340 and the second wavelength conversion pattern 350.

In FIG. 10, the plurality of spacers SPC may be formed on the second substrate 30, so that one ends of the plurality of spacers SPC may be coupled to the third capping layer 395, and the other ends thereof may be in contact with the second capping layer 393*d*. In this case, unlike the embodiment of FIG. 9, a part of the first capping layer 391*d* and a part of the second capping layer 393*d* may be sandwiched between the other ends of the plurality of spacers SPC and the partition wall 380. In some embodiments, the plurality of spacers SPC may be formed on the first substrate 10, so that one ends of the plurality of spacers SPC may be in contact with the third capping layer 395, and the other ends thereof may be coupled to the second capping layer 393*d*.

The embodiment of FIG. 10 is substantially the same as or similar to the embodiment of FIG. 9. Therefore, hereinafter, redundant descriptions will be omitted.

Figure 11:
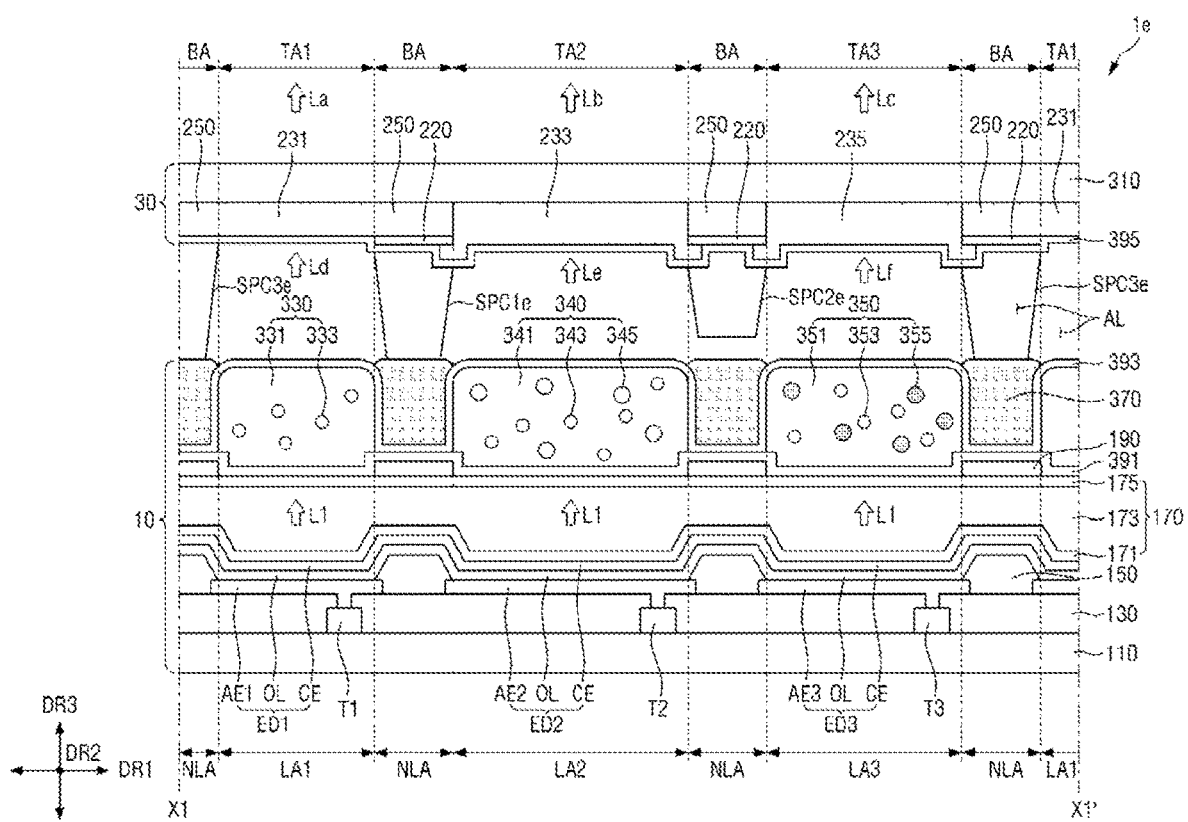
FIG. 11 is a cross-sectional view of a display device according to another embodiment.

FIG. 11 is a cross-sectional view of a display device according to another embodiment.

The embodiment of FIG. 11 is different from the embodiment of FIGS. 1, 2, 3, 4, 5, and 6 in that at least one of a first spacer SPC1*e*, a second spacer SPC2*e*, and a third spacer SPC3*e* has a different height from other spacers.

Referring to FIG. 11, at least one of the first spacer SPC1*e*, the second spacer SPC2*e*, and the third spacer SPC3*e* may have a different height from other spacers. In some embodiments, the length of the second spacer SPC2*e* in the third direction DR3 may be longer than the length of each of the first spacer SPC1*e* and the third spacer SPC3*e* in the third direction DR3. In this case, the other ends of the first spacer SPC1*e* and the third spacer SPC3*e* may be in contact with the second substrate 30, and the other end of the second spacer SPC2*e* may be spaced apart from the second substrate 30 in the third direction DR3. In this case, the first spacer SPC1*e* and the third spacer SPC3*e* may serve to maintain a gap between the first substrate 10 and the second substrate 30 in a normal non-pressurized state, and the second spacer SPC2*e* may serve to maintain a gap between the first substrate 10 and the second substrate 30 in a pressurized state. In some embodiments, the length of each of the first spacer SPC1*e* and the third spacer SPC3*e* may be shorter than the length of the second spacer SPC2*e*. In this case, the other end of the second spacer SPC2*e* may be in contact with the second substrate 30, and the first spacer SPC1*e* and the third spacer SPC3*e* may be spaced apart from the second substrate 30. In some embodiments, only one of the first spacer SPC1*e*, the second spacer SPC2*e*, and the third spacer SPC3*e* may be in contact with the second substrate 30. For example, the length of the first spacer SPC1*e* or the third spacer SPC3*e* may be longer than those of other spacers, and only the first spacer SPC1*e* or the third spacer SPC3*e* may be in contact with the second substrate 30.

The embodiment of FIG. 11 is substantially the same as or similar to the embodiment of FIGS. 1, 2, 3, 4, 5, and 6 except that at least one of the plurality of spacers has a different height from other spacers. Therefore, hereinafter, redundant descriptions will be omitted.

Figure 12:
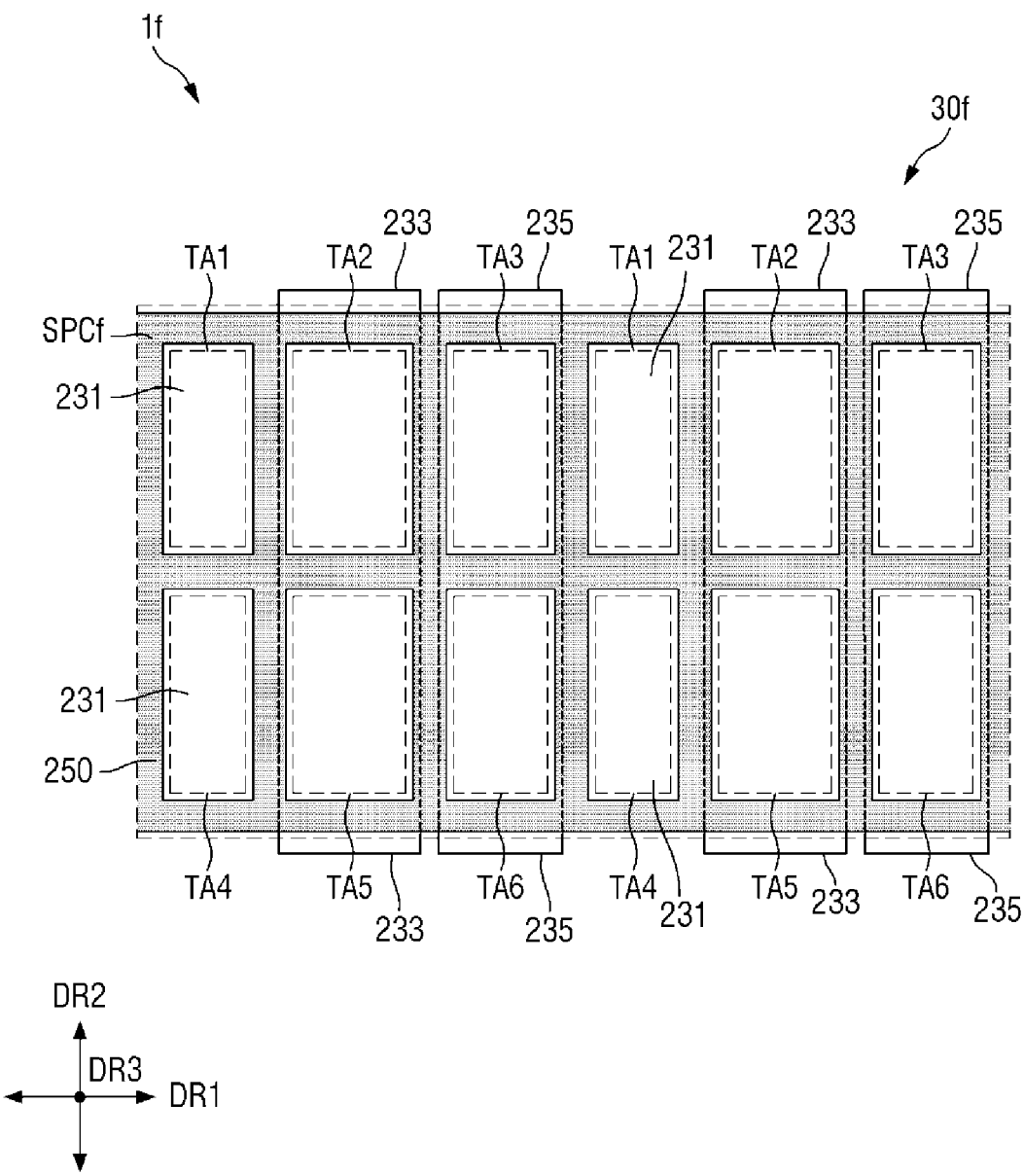
FIG. 12 is a plan view of a second substrate of a display device according to another embodiment.

FIG. 12 is a plan view of a second substrate of a display device according to another embodiment.

The embodiment of FIG. 12 is different from the embodiment of FIGS. 1, 2, 3, 4, 5, and 6 in that a spacer SPCf is formed in a lattice form.

Referring to FIGS. 4 and 12, the spacer SPCf may have a shape of a wall having a predetermined height in the third direction DR3, and may be disposed in a lattice form in the row-direction extension region RER_C and column-direction extension region CER_C of the light blocking area BA. The spacer SPCf may be disposed in the light blocking area BA. In some embodiments, in a plan view, the edge of the spacer SPCf may be spaced apart from the edges of the first light transmitting area TA1, the second light transmitting area TA2, the third light transmitting area TA3, the fourth light transmitting area TA4, the fifth light transmitting area TA5, and the sixth light transmitting area TA6. That is, in a plan view, the width of the spacer SPCf may be smaller than the width of the row-direction extension region RER_C and/or column-direction extension region CER_C of the light blocking area BA. In some embodiments, in a plan view, the edge of the spacer SPCf may overlap the edges of the first light transmitting area TA1, the second light transmitting area TA2, the third light transmitting area TA3, the fourth light transmitting area TA4, the fifth light transmitting area TA5, and the sixth light transmitting area TA6 in the thickness direction.

Although it is illustrated in FIG. 12 that the spacer SPCf having a wall shape is formed on the second substrate 30, the present disclosure is not limited thereto. In some embodiments, similarly to the embodiment of FIG. 12, the spacer SPCf may be disposed in a lattice form in the non-light emitting area NLA of the first substrate 10.

The embodiment of FIG. 12 is substantially the same as or similar to the embodiment of FIGS. 1, 2, 3, 4, 5, and 6 except that the spacer SPCf is disposed in a lattice form. Therefore, hereinafter, redundant descriptions will be omitted.

Figure 13:
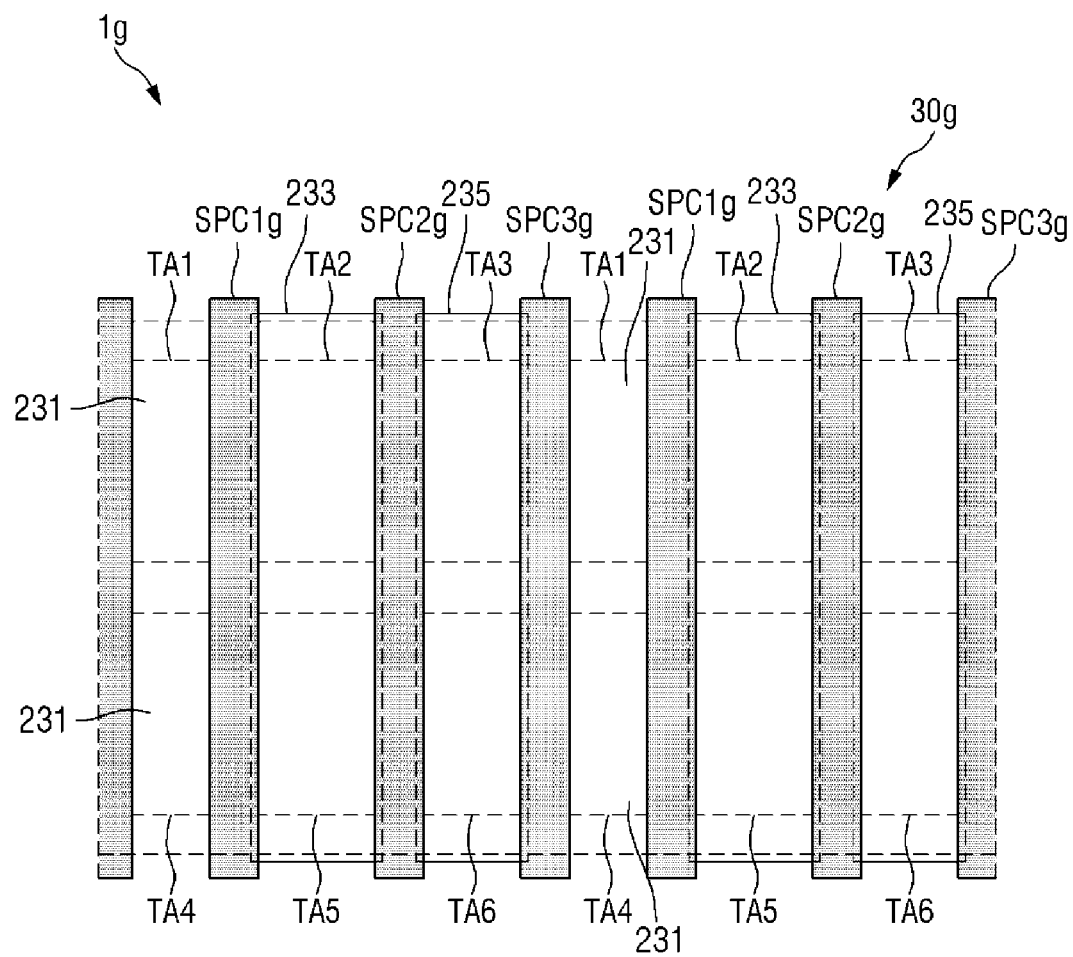
FIG. 13 is a plan view of a display device according to another embodiment.
Figure 13:
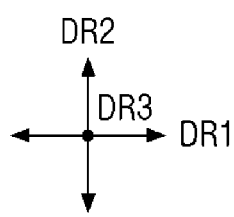

FIG. 13 is a plan view of a display device according to another embodiment.

The embodiment of FIG. 13 is different from the embodiment of FIG. 12 in that a first spacer SPC1*g*, a second spacer SPC2*g*, and a third spacer SPC3*g* are arranged in a long stripe shape in the second direction DR2.

Referring to FIGS. 4 and 13, similarly to the second color filter 233 and the third color filter 235, the first spacer SPC1*g*, the second spacer SPC2*g*, and the third spacer SPC3*g* may be arranged in a long stripe shape in the second direction DR2. That is, the first spacer SPC1*g*, the second spacer SPC2*g*, and the third spacer SPC3*g* may be arranged only in the column-direction extension region CER_D of the light blocking area BA. Specifically, the first spacer SPC1*g* may be disposed in the column-direction extension area CER_D passing between the first light transmitting area TA1 and the second light transmitting area TA2 and between the fourth light transmitting area TA4 and the fifth light transmitting area TA5. Further, the second spacer SPC2*g* may be disposed in the column-direction extension region CER_D passing between the second light transmitting area TA2 and the third light transmitting area TA3 and between the fifth light transmitting area TA5 and the sixth light transmitting area TA6, and the third spacer SPC3*g* may be disposed in the column-direction extension region CER_D passing between the third light transmitting area TA3 and the first light transmitting area TA1 and between the sixth light transmitting area TA6 and the fourth light transmitting area TA4. In some embodiments, at least one of the first spacer SPC1*g*, the second spacer SPC2g, and the third spacer SPC3g may be omitted. For example, the second spacer SPC2g may be omitted.

Although it is illustrated in FIG. 13 that the first spacer SPC1g, the second spacer SPC2g, and the third spacer SPC3g are formed on the second substrate 30, the present disclosure is not limited thereto. In some embodiments, similarly to the embodiment of FIG. 13, the first spacer SPC1g, the second spacer SPC2g, and the third spacer SPC3g may be arranged in the non-light emitting area NLA of the first substrate 10 in a long stripe shape in the second direction DR2.

The embodiment of FIG. 13 is substantially the same as or similar to the embodiment of FIG. 12 except that the first spacer SPC1g, the second spacer SPC2g, and the third spacer SPC3g may be arranged in a long stripe shape in the second direction DR2. Therefore, hereinafter, redundant descriptions will be omitted.

Figure 14:
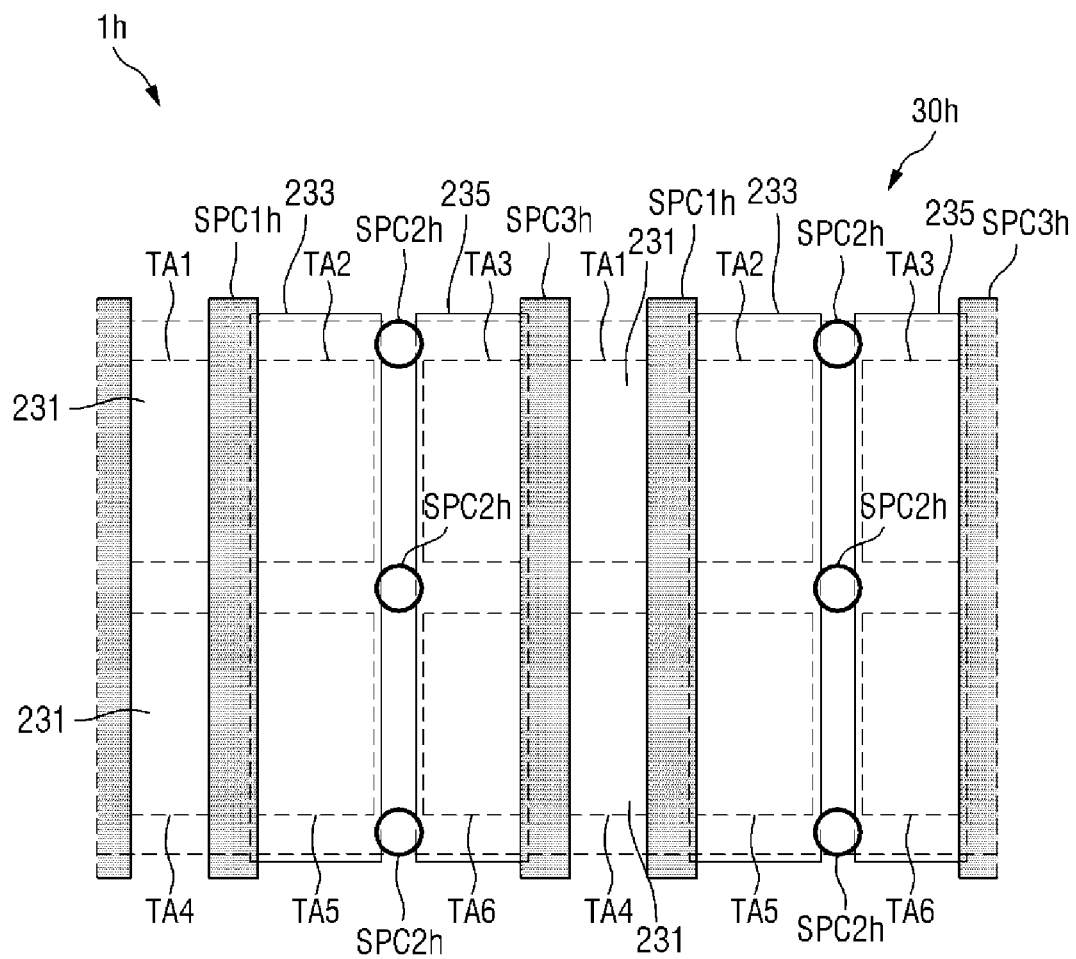
FIG. 14 is a plan view of a first substrate of a display device according to another embodiment.

FIG. 14 is a plan view of a first substrate of a display device according to another embodiment.

The embodiment of FIG. 14 is different from the embodiment of FIG. 13 in the shape of a second spacer SPC2h.

Referring to FIGS. 4 and 14, a first spacer SPC1h and a third spacer SPC3h may have a long stripe shape in the second direction DR2, and a second spacer SPC2h may have a pillar shape. Specifically, the first spacer SPC1h may be disposed in the column-direction extension area CER_C between the first light transmitting area TA1 and the second light transmitting area TA2 and between the fourth light transmitting area TA4 and the fifth light transmitting area TA5, and the third spacer SPC3h may be disposed in the column-direction extension region CER_C between the third light transmitting area TA3 and the first light transmitting area TA1 and between the sixth light transmitting area TA6 and the fourth light transmitting area TA4. In this case, the second spacer SPC2h may be disposed in the crossing region CSR_C where the column-direction extension region CER_C passing between the second light transmitting area TA2 and the third light transmitting area TA3 and between the fifth light transmitting area TA5 and the sixth light transmitting area TA6 crosses the raw-direction extension region RER_C passing between the second light transmitting area TA2 and the fifth light transmitting area TA5 and between the third light transmitting area TA3 and the sixth light transmitting area TA6. In some embodiments, only the first spacer SPC1h may have a stripe shape, and each of the second spacer SPC2h and the third spacer SPC3h may have a pillar shape.

Referring to FIGS. 11 and 14, in some embodiments, the length of each of the first spacer SPC1h and the third spacer SPC3h in the third direction DR3 may be longer than the length of the second spacer SPC2h in the third direction DR3. In this case, the other ends of the first spacer SPC1h and the third spacer SPC3h may be in contact with the first substrate 10, and the other end of the second spacer SPC2h may be spaced apart from the first substrate 10. In some embodiments, the first spacer SPC1h, the second spacer SPC2h, and the third spacer SPC3h may have the same length.

Although it is illustrated in FIG. 14 that the first spacer SPC1h, the second spacer SPC2h, and the third spacer SPC3h are formed on the second substrate 30, the present disclosure is not limited thereto. In some embodiments, similarly to the embodiment of FIG. 14, the first spacer SPC1h, the second spacer SPC2h, and the third spacer SPC3h may be arranged in the non-light emitting area NLA of the first substrate 10 in a long stripe shape in the second direction DR2.

The embodiment of FIG. 14 is substantially the same as or similar to the embodiment of FIG. 13 except that the shape of the second spacer SPC2h is different from that of the embodiment of FIG. 13. Therefore, hereinafter, redundant descriptions will be omitted.

Figure 15:
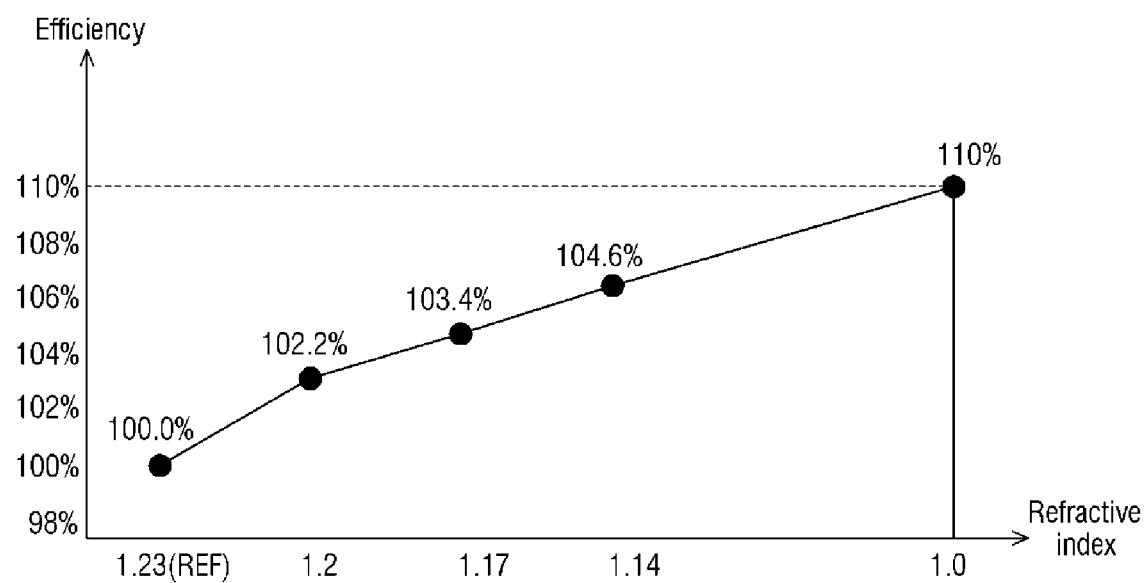
FIG. 15 is a graph illustrating an experiment result of light efficiency of a display device according to a refractive index of a layer disposed between a first wavelength conversion pattern and a second color filter and/or between a second wavelength conversion pattern and a third color filter.

FIG. 15 is a graph illustrating an experiment result of light efficiency of a display device according to a refractive index of a layer disposed between a first wavelength conversion pattern and a second color filter and/or between a second wavelength conversion pattern and a third color filter.

In FIG. 15, the horizontal axis represents the refractive index of a layer disposed between the first wavelength conversion pattern 340 and the second color filter 233 and between the second wavelength conversion pattern 350 and the third color filter 235, and the vertical axis represents the light efficiency of the display device 1.

Referring to FIG. 15, as the refractive index of a layer disposed between the first wavelength conversion pattern 340 and the second color filter 233 and between the second wavelength conversion pattern 350 and the third color filter 235 increases, the light efficiency of the display device 1 may increase. Specifically, when the light efficiency is 100% in the case where the refractive index is about 1.23, it may be observed that the light efficiency is improved up to 102.2%, 103.4%, and 104.6% in the case where the refractive index is 1.2, 1.17, and 1.14, and may be observed that the light efficiency is about 110% in the case where the refractive index is about 1.0, that is, in the case where the air layer AL is disposed.

That is, in the display device 1 according to an embodiment, the air layer AL may be disposed between the first wavelength conversion pattern 340 and the second color filter 233 and between the second wavelength conversion pattern 350 and the third color filter 235, thereby greatly improving the light efficiency of the display device 1, as compared with the case where a material having a refractive index of about 1.23, for example, a filling material is disposed between the first substrate 10 and the second substrate 30.

According to a display device of an embodiment, reflection or total reflection of light incident on a wavelength conversion pattern may be induced, thereby increasing the traveling path of the light in the wavelength conversion pattern. Accordingly, it is possible to increase wavelength conversion efficiency and improve light emission efficiency.

Further, color mixing may be prevented by suppressing emission light of a light emitting element from entering the neighboring pixels of different colors, and light emission efficiency may be improved by reducing the light loss through color filters of neighboring pixels.

Although the preferred embodiments of the present disclosure have been disclosed for illustrative purposes, those skilled in the art will appreciate that various modifications, additions and substitutions are possible, without departing from the scope and spirit of the disclosure as disclosed in the accompanying claims.

In concluding the detailed description, those skilled in the art will appreciate that many variations and modifications can be made to the preferred embodiments without substantially departing from the principles of the present disclosure. Therefore, the disclosed preferred embodiments of the disclosure are used in a generic and descriptive sense only and not for purposes of limitation.

What is claimed is:

1. A display device, comprising:
a first base portion;
a second base portion facing the first base portion;
a first light emitting element including a light emitting layer disposed on one surface of the first base portion and emitting blue light;
a first wavelength conversion pattern disposed on the first light emitting element and converting blue light into red light;
a red color filter overlapping the first wavelength conversion pattern on one surface of the second base portion and spaced apart from the first wavelength conversion pattern;
an air layer interposed between the first wavelength conversion pattern and the red color filter;
a second light emitting element disposed on the first base portion and emitting blue light;
a second wavelength conversion pattern disposed on the second light emitting element and converting blue light into green light;
a first capping layer disposed on the first wavelength conversion pattern;
a second capping layer disposed between the red color filter and the air layer; and
a color mixing prevention member disposed between the first wavelength conversion member and the second wavelength conversion member,
wherein the air layer is disposed between the first capping layer and the second capping layer to directly contact the first capping layer and the second capping layer,
wherein the first capping layer is in direct contact with the first wavelength conversion pattern, and
wherein the color mixing prevention member is disposed on the first capping layer.

2. The display device of claim 1,
wherein the first capping layer is disposed between the first wavelength conversion pattern and the color mixing prevention member and between the second wavelength conversion pattern and the color mixing member.

3. The display device of claim 1,
wherein the display device further comprises:
a green color filter disposed on the one surface of the second base portion;
a light blocking member disposed between the red color filter and the green color filter; and
a spacer disposed to overlap the light blocking member in a thickness direction.

4. The display device of claim 1, further comprising:
a blue color filter disposed on the one surface of the second base portion;
a color pattern disposed between the red color filter and the blue color filter; and
a spacer disposed to overlap the color pattern in a thickness direction.

5. The display device of claim 4,
wherein the blue color filter and the color pattern are made of a same material.

6. A display device, comprising:
a first base portion including a first light emitting area, a second light emitting area and a non-light emitting area surrounding the first light emitting area and the second light emitting area;
a second base portion spaced apart from the first base portion along a thickness direction, the second base portion including a first light transmitting area, a second light transmitting area and a light blocking area surrounding the first light transmitting area and the second light transmitting area;
a wavelength conversion pattern including a first wavelength conversion member disposed in the first light emitting area of the first base portion and a second wavelength conversion member disposed in the second light emitting area of the first base portion;
a color filter including a first color filter disposed in the first light transmitting area of the second base portion and facing the first wavelength conversion member and a second color filter disposed in the second light transmitting area of the second base portion and facing the second wavelength conversion member;
an air layer interposed between the wavelength conversion pattern and the color filter;
a spacer disposed between the wavelength conversion pattern and the color filter and having a side surface at least partially surrounded by the air layer;
a first capping layer disposed on the wavelength conversion pattern;
a second capping layer disposed between the color filter and the air layer; and
a color mixing prevention member disposed between the first wavelength conversion member and the second wavelength conversion member,
wherein the air layer is disposed between the first capping layer and the second capping layer to directly contact the first capping layer and the second capping layer,
wherein the first capping layer is in direct contact with the first wavelength conversion pattern, and
wherein the color mixing prevention member is disposed on the first capping layer.

7. The display device of claim 6,
wherein the spacer, the non-light emitting area, and the light blocking area are disposed to overlap in the thickness direction.

8. The display device of claim 7,
wherein the light blocking area and the light emitting area includes a row-direction extension region extending in a first direction, a column-direction extension region extending in a second direction crossing the first direction, and a crossing region in which the row-direction extension region crosses the column-direction extension region, and
at least a part of the spacer is disposed in the crossing region.

9. The display device of claim 8,
wherein the spacer has a pillar shape, and is disposed in the crossing region.

10. The display device of claim 7,
wherein the spacer is disposed on the column-direction extension region of the light blocking area in a long stripe shape in a second direction.

11. The display device of claim 6,
wherein the second base portion
further includes a third light transmitting area, the first light transmitting area, the second light transmitting area and the third light transmitting area are sequentially arranged in one direction, and
the spacer includes a first spacer disposed in the light blocking area between the first light transmitting area and the second light transmitting area, a second spacer disposed in the light blocking area between the second light transmitting area and the third light transmitting area, and a third spacer disposed in the light blocking area between the third light transmitting area and the first light transmitting area.

12. The display device of claim 11, wherein a distance between the first spacer and the second spacer is different from a distance between the second spacer and the third spacer.

13. The display device of claim 6, wherein the spacer is disposed on one surface of the color filter facing the first base portion.

14. The display device of claim 6, wherein a difference in refractive index between the wavelength conversion pattern and the air layer is 0.6 or more.

15. The display device of claim 6, wherein a difference in refractive index between the color filter and the air layer is 0.4 or more.

* * * * *